(12) United States Patent
Smith et al.

(10) Patent No.: US 9,588,190 B2
(45) Date of Patent: Mar. 7, 2017

(54) RESONANT MEMS LORENTZ-FORCE MAGNETOMETER USING FORCE-FEEDBACK AND FREQUENCY-LOCKED COIL EXCITATION

(71) Applicant: Silicon Laboratories Inc., Austin, TX (US)

(72) Inventors: Eric B. Smith, Austin, TX (US); Riad Wahby, Austin, TX (US); Yan Zhou, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 475 days.

(21) Appl. No.: 13/729,516

(22) Filed: Dec. 28, 2012

(65) Prior Publication Data

US 2014/0049256 A1    Feb. 20, 2014

Related U.S. Application Data

(60) Provisional application No. 61/675,426, filed on Jul. 25, 2012.

(51) Int. Cl.
*G01R 33/028* (2006.01)
*B81B 3/00* (2006.01)

(52) U.S. Cl.
CPC ........ *G01R 33/0286* (2013.01); *B81B 3/0032* (2013.01)

(58) Field of Classification Search
CPC .......................... G01R 33/0286; B81B 3/0032
USPC ......................................................... 324/259
See application file for complete search history.

(56) References Cited

U.S. PATENT DOCUMENTS

| | | | |
|---|---|---|---|
| 6,325,521 B1 * | 12/2001 | Gregg et al. | 362/106 |
| 6,822,929 B1 | 11/2004 | Schubert et al. | |
| 7,046,002 B1 * | 5/2006 | Edelstein | 324/244 |
| 2006/0032308 A1 * | 2/2006 | Acar | G01C 19/5719 73/504.12 |
| 2009/0206987 A1 * | 8/2009 | Aubin | G06K 7/10336 340/5.8 |
| 2009/0322448 A1 | 12/2009 | Bhave et al. | |
| 2011/0050214 A1 * | 3/2011 | Bahreyni et al. | 324/244 |
| 2012/0206134 A1 * | 8/2012 | Fischer et al. | 324/244 |
| 2013/0002244 A1 | 1/2013 | Quevy | |

OTHER PUBLICATIONS

Gerhardts, Rolf, Path-Integral approach to the two-dimensional magneto-conductivity problem, Z. Physik, B 21, 285-294, 1975.*
Behreyni, B. et al., A resonant micromachined magnetic field sensor, IEEE Sensors Journal, V. 7, No. 9, 2007, p. 1326-1334.*

(Continued)

*Primary Examiner* — Thomas Valone
(74) *Attorney, Agent, or Firm* — Zagorin Cave LLP

(57) ABSTRACT

A method includes supplying a current to at least one conductive path integral with a MEMS device to thereby exert a Lorentz force on the MEMS device in the presence of a magnetic field. The method includes determining the magnetic field based on a control value in a control loop configured to maintain a constrained range of motion of the MEMS device. The control loop may be configured to maintain the MEMS device in a stationary position. The current may have a frequency equal to a resonant frequency of the MEMS device.

25 Claims, 15 Drawing Sheets

(56) References Cited

OTHER PUBLICATIONS

Li, Mo, et al., Three-axis lorentz force magnetic sensor for electronic compass applications, J. of Micromechanical Sys., V. 21, N. 4, 2012, p. 1002-1010.*
3-Axis Electronic Compass AK8975/B Datasheet, Asahi Kasei Microdevices Corp., 2 pp., URL: <http://www.asahi-kasei.co.jp/akm/en/product/ak8975b/ak8975b.html> downloaded Oct. 2011.
Bahreyni, Behraad, "A Resonant Micromachined Magnetic Field Sensor," IEEE Sensors Journal, vol. 7, No. 9, pp. 1326-1334, Sep. 2007.
Brugger, Simon and Paul, Oliver, "Field-Concentrator-Based Resonant Magnetic Sensor with Integrated Planar Coils," Journal of Microelectromechanical Systems, vol. 18, No. 6, pp. 1432-1443, Dec. 2009.
Emmerich, Harald and Schofthaler, Martin, "Magnetic Field Measurements with a Novel Surface Micromachined Magnetic-Field Sensor," IEEE Transactions on Electron Devices, vol. 47, No. 5, pp. 972-977, May 2000.
Eyre, Beverley and Pister, Kristofer S. J., "Micromechanical Resonant Magnetic Sensor in Standard CMOS," 1997 IEEE International Conf. on Solid-State Sensors and Actuators, pp. 405-408, Jun. 16-19, 1997.
Freescale, "Three-Axis, Digital Magnetometer," MAG3110, Freescale Semiconductor, Inc., rev. 2.0, 25 pp., Feb. 2011.
Herrera-May, Agustin L. et al., "Resonant Magnetic Field Sensors Based on MEMS Technology," Sensors 2009, 9, pp. 7785-7813, www.mdpi.com/journal/sensors, Sep. 30, 2009.
Izham, Zaki et al., "Development of a Resonant Magnetometer," Nanotech 2003, vol. 1, www.nsti.org, ISBN 0-9728422-0-9, 4 pp., 2003.
Kadar, Zsolt et al., "Integrated Resonant Magnetic-Field Sensor," Sensors and Actuators A: Physical, vol. 41, issues 1-3, pp. 66-69, Apr. 1, 1994.
Ren, Dahai et al., "Design and Analyses of a MEMS Based Resonant Magnetometer," Sensors 2009, 9, pp. 6951-6966, www.mdpi.com/journal/sensors, Sep. 2, 2009.
Sunier, Robert et al., "Resonant Magnetic Field Sensor with Frequency Output," Journal of Microelectromechanical Systems, vol. 15, No. 5, pp. 1098-1107, Oct. 2006.
Thompson, Matthew J. and Horsley, David A., "Resonant MEMS Magnetometer with Capacitive Read-Out," IEEE Sensors 2009 Conference, pp. 992-995, Jan. 2009.
U.S. Appl. No. 13/281,928, filed Oct. 26, 2011, entitled "Electronic Damper Circuit for MEMS Sensors and Resonators", inventor Eric B. Smith.

* cited by examiner

RESONANT MEMS LORENTZ-FORCE MAGNETOMETER USING FORCE-FEEDBACK AND FREQUENCY-LOCKED COIL EXCITATION

CROSS-REFERENCE TO RELATED APPLICATION(S)

This application claims benefit to provisional application 61/675,426, filed Jul. 25, 2012, entitled "Resonant MEMS Lorentz-Force Magnetometer Using Force-Feedback and Frequency Locked Coil Excitation," naming Eric B. Smith, Riad Wahby, and Yan Zhou as inventors, which application is incorporated herein by reference in its entirety.

BACKGROUND

Field of the Invention

Embodiments of the invention pertain to the field of microelectromechanical systems (MEMS) and more particularly to magnetic field sensing using MEMS.

Description of the Related Art

Magnetic sensors can be found in many applications across a wide range of industries. For example, magnetic sensors can be found in automotive, consumer, industrial, medical, and aerospace applications. The magnetic sensor may be used to determine the orientation of a device with respect to its environment. In consumer applications, they can be found as sensors to detect when devices (e.g., cell phones, laptop computers, doors, etc.) are opened or closed. In addition, cell phones incorporate magnetic sensors to provide an electronic compass and navigation capability to complement GPS tracking. A relatively wide bandwidth magnetic sensor can be combined with an accelerometer to make a gyroscope.

Many different approaches have been used to detect magnetic fields including giant magneto-resistance (GMR), Fluxgate, anisotropic magnetoresistance (AMR), and Hall effect sensors, which exploit the Hall effect. Of those approaches, only Hall, GMR, and AMR sensors are capable of integration with integrated circuits, which provides a small form factor. In Hall effect sensors, when a voltage is applied across a semiconductor material, charge carriers begin to flow. If a magnetic field is applied orthogonal to the surface of the semiconductor material, the current carriers deflect to the side because of the Lorentz force causing a charge to build up on one side of the material. That results in a voltage across the semiconductor material orthogonal to the current carrier flow. The resulting Hall voltage is a measure of the magnetic field. A Hall effect sensor system may include a magnetic concentrator, e.g., a ferromagnetic material that is deposited on a surface of a semiconductor wafer over the Hall effect sensor to enhance the magnetic field. While Hall effect sensors are widely used, they can be bulky, particularly if magnetic field sensing in three axes is desirable. The Hall sensor system may occupy considerable space and depending on the application, can often require a separate integrated circuit.

Accordingly, improved magnetic sensors that are small and efficient are desirable.

SUMMARY OF EMBODIMENTS OF THE INVENTION

In at least one embodiment of the invention, a method includes supplying a current to at least one conductive path integral with a MEMS device to thereby exert a Lorentz force on the MEMS device in the presence of a magnetic field. The method includes determining the magnetic field based on a control value in a control loop configured to maintain a constrained range of motion of the MEMS device. The control loop may be configured to maintain the MEMS device in a stationary position. The current may have a frequency equal to a resonant frequency of the MEMS device.

In at least one embodiment of the invention, a magnetic sensor includes a MEMS device. The MEMS device includes a mass suspended from a substrate, at least one conductive path integral with the mass to allow a current to flow into and out of the mass. The MEMS device is configured to exert a Lorentz force on the mass when a current flows through the conductive path in the presence of a magnetic field. The MEMS device includes a drive actuation transducer configured to apply a force to constrain a range of motion of the mass in a stationary position in response to a control signal indicative of the magnetic field. The force may maintain the mass in a stationary position. The conductive path may be configured to receive a current having a frequency locked to a resonant frequency of the MEMS device.

In at least one embodiment of the invention, a method includes supplying a current to at least one conductive path integral with a MEMS device to thereby exert a Lorentz force on the MEMS device in the presence of a magnetic field. The method includes varying a frequency of the current over a range of frequencies. The method includes determining a frequency spectrum of a time-varying magnetic field having a bandwidth that exceeds a bandwidth of the MEMS device based on control values in a control loop. Individual frequency components of the frequency spectrum of the time-varying magnetic field correspond to individual frequencies of the range of frequencies.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments of the invention exploit microelectromechanical systems (MEMS) devices to sense magnetic fields using a MEMS Lorentz-force magnetometer configured in a force-feedback control loop. Before describing embodiments of the invention, some background information on MEMS devices is provided. In general, a MEMS device has dimensions in the micron scale and has both electrical and mechanical components that form a system. MEMS devices include resonators, sensors, and actuators, which may be used in various applications, e.g., oscillators in timing applications, accelerometers, gyroscopes, and inertial sensors, and the number of applications is growing. Certain structural components of a MEMS device are typically capable of some form of mechanical motion. MEMS devices may be formed as a separate MEMS device or formed as part of an integrated circuit using a MEMS manufacturing process that is compatible with complementary metal-oxide-semiconductor (CMOS) integrated circuit manufacturing techniques (e.g., Low Pressure Chemical Vapor Deposition, (LPCVD), Plasma Enhanced CVD (PECVD), patterning using photolithography, and Reactive Ion Etching (RIE), etc.) or other integrated circuit manufacturing processes.

The mechanical systems of a typical MEMS device may be modeled as a harmonic resonator (FIG. 1) having a natural or resonance frequency, $$\omega_0 = \sqrt{\frac{k}{m}},$$

and a quality factor, $$Q = \frac{\omega_0 m}{\gamma},$$

where k is a spring constant, m is mass, and γ is a damping coefficient. The quality factor of a resonator is a dimensionless parameter that describes how under-damped an oscillator or resonator is, or equivalently, characterizes the bandwidth of the resonator relative to its center frequency. A higher Q indicates a lower rate of energy loss relative to the stored energy of the resonator, i.e., the oscillations die out more slowly. For a sinusoidally driven resonator, an increased Q corresponds to greater amplitudes of resonation, but a smaller range of frequencies around the resonant frequency for which it resonates (i.e., smaller bandwidth). Although in some applications higher selectivity (i.e., higher Q) is a critical design parameter for a MEMS device, in other applications, a wider bandwidth (i.e., lower Q) is a critical design parameter.

Figure 1:
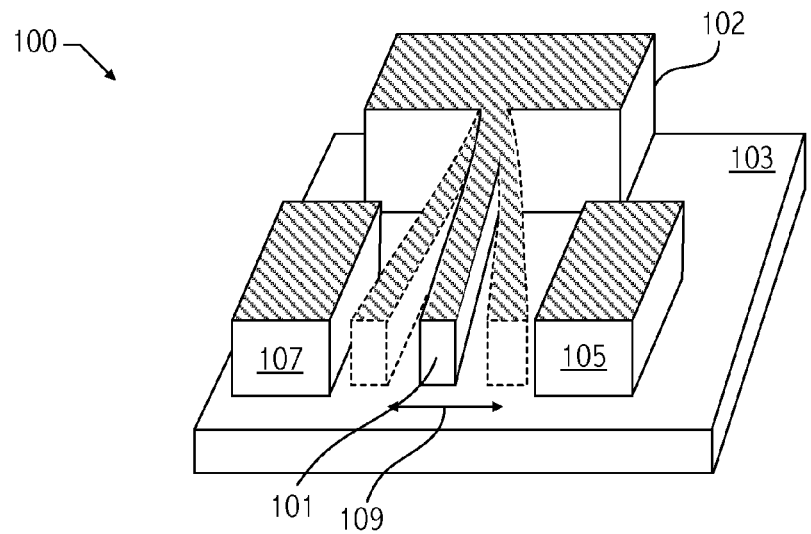
FIG. 1 illustrates a conventional MEMS resonator.

A MEMS device may have a variety of physical shapes, e.g., beams and plates. FIG. 1 illustrates a conventional MEMS device 100 that has a member 101 coupled to an anchor 102, which in turn is coupled to the substrate 103. The MEMS device includes electrodes 105 and 107, which form electrostatic transducers with the member. The electrodes may be configured to function as sense electrodes. The electrodes are coupled to appropriate voltage levels provided through appropriate conductive paths in the substrate and member 101 is coupled to an appropriate voltage level through the anchor 102. During operation as an inertial sensor, member 101 dynamically deflects in response to motion of MEMS device 100. A sense electrode 107 detects a change in capacitance as the capacitance varies between member 101 and electrode 107 due to the "in-plane" motion of member 101. The sensed capacitance corresponds to the displacement of member 101 in direction 109. As is well known in the art, a MEMS device may use other vibration modes such as out-of-plane or torsional modes.

Figure 2A:
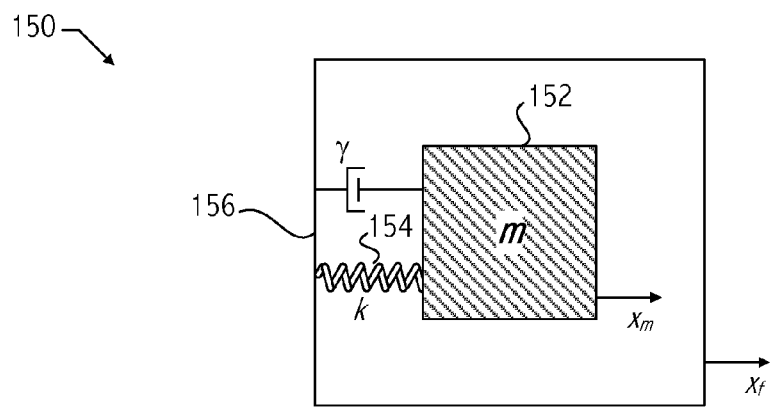
FIG. 2A illustrates a model of an exemplary MEMS device.
Figure 2B:
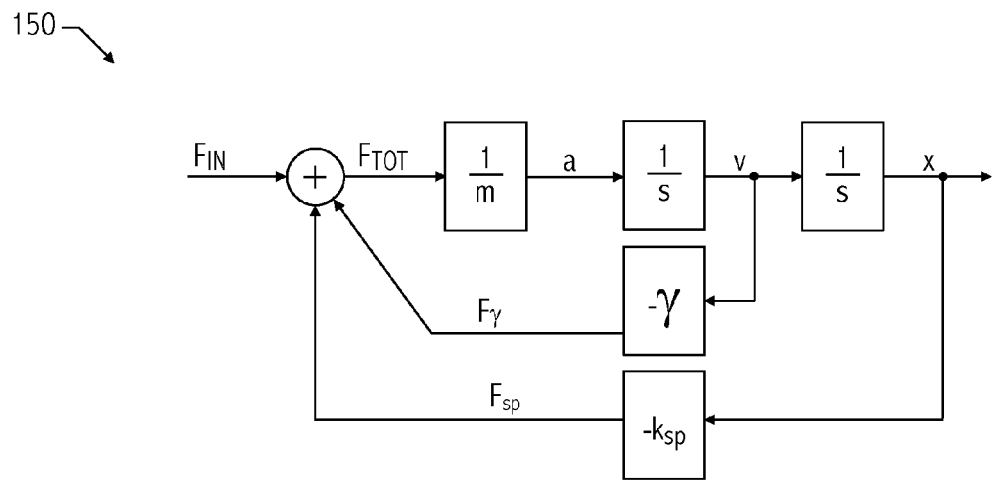
FIG. 2B illustrates another representation of the exemplary MEMS device of FIG. 2A.

Referring to FIGS. 2A and 2B, in a typical sensor application MEMS device 150 includes a proof mass 152 having a mass m anchored to a frame 156 by a flexible spring 154 having a spring constant k. Due to mass inertia, motion of proof mass 152 lags motion of frame 156. The difference in displacement of the mass and the frame, e.g., displacement $x=x_f-x_m$, where $x_m$ is the position of the mass and $x_f$ is the position of the frame (e.g., substrate), can be used to determine acceleration of device 150. The total force acting on mass 152, $F_{TOT}$, is the sum of the inertial forces acting on mass 152 (e.g., $F_{IN}$) and external forces acting on mass 152 (e.g., damping force, $F_\gamma=-\gamma\dot{x}$, and spring force, $F_S=-kx$), and may be represented as follows:

$$F_{TOT}=m\ddot{x}+\gamma\dot{x}+kx,$$

where $\gamma$ is the damping coefficient. In general, a damping force is proportional to the mass velocity $\dot{x}$ (e.g., $F_\gamma=-\gamma\dot{x}$).

Figure 3A:
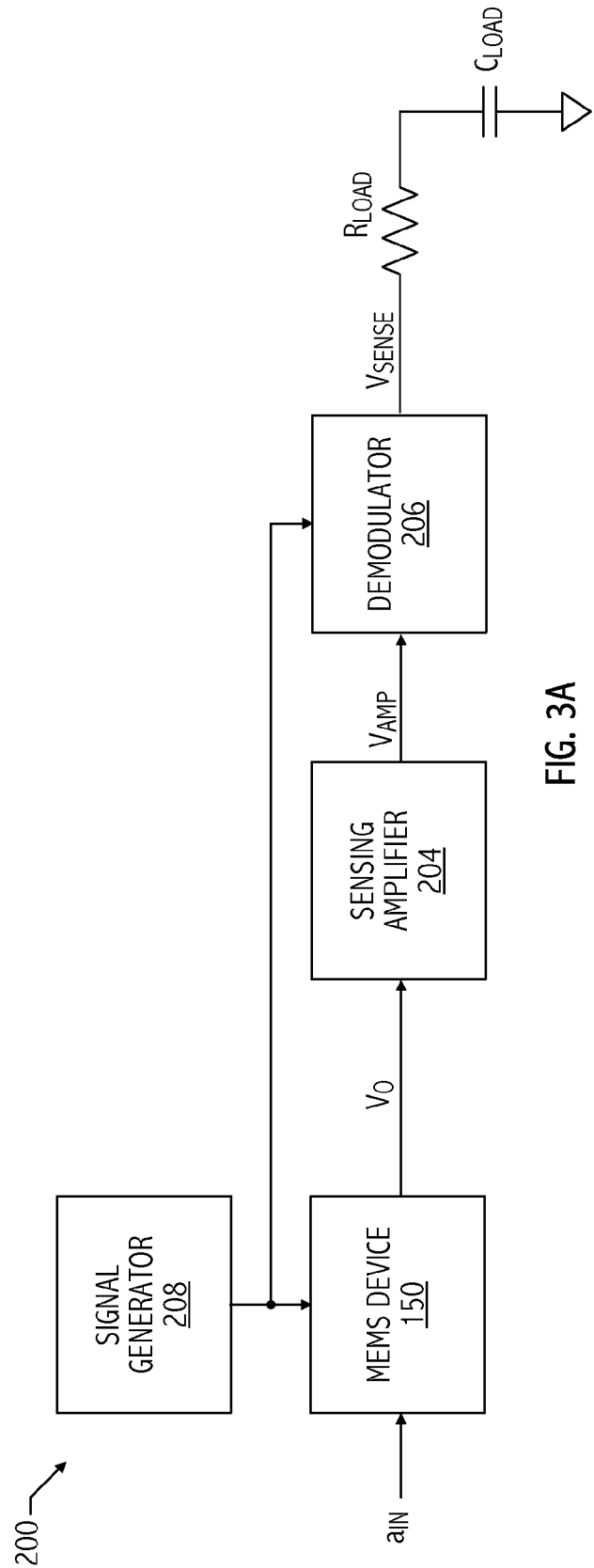
FIG. 3A illustrates a functional block diagram of a typical MEMS sensing system.
Figure 3B:
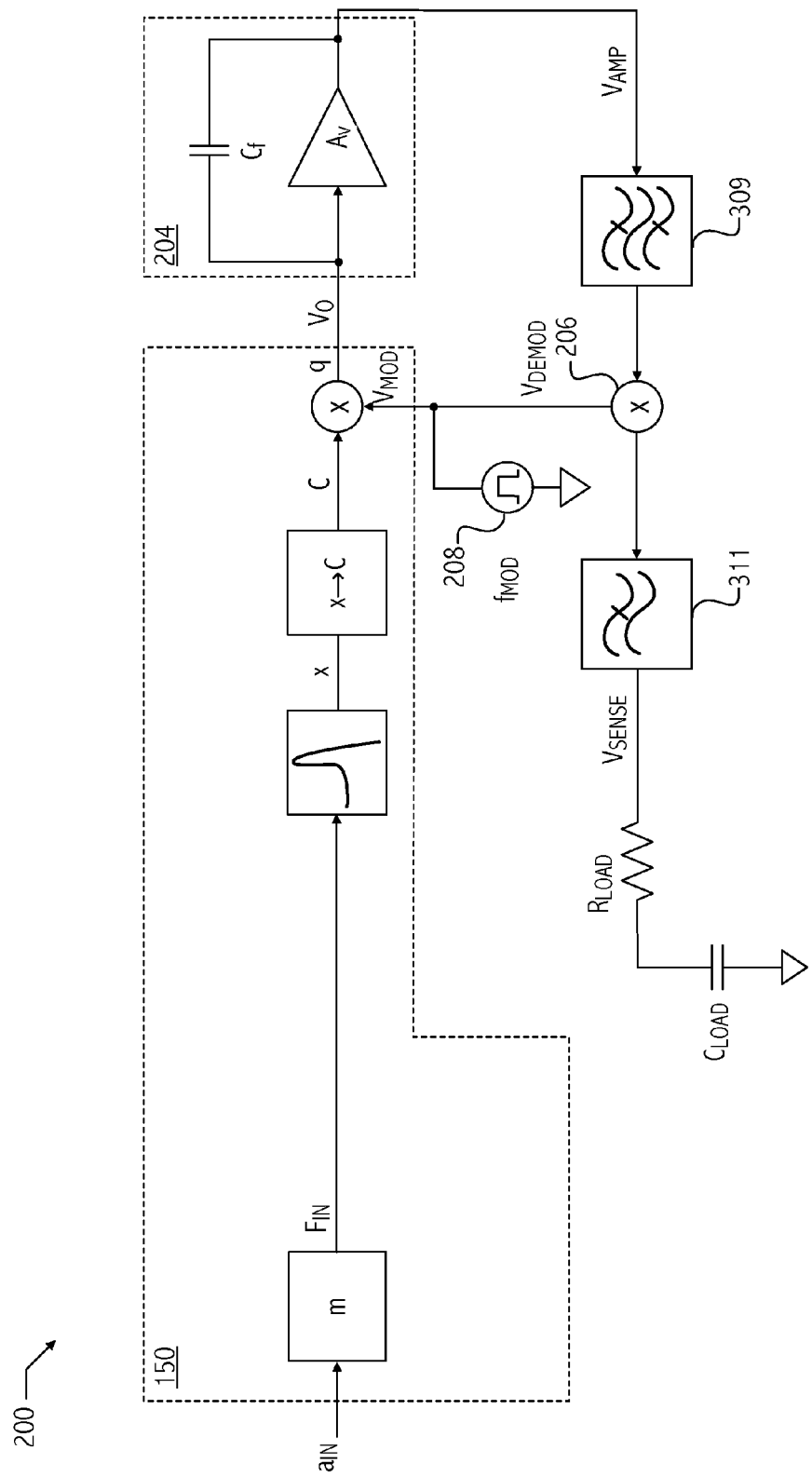
FIG. 3B illustrates another representation of the MEMS sensing system of FIG. 3A.

Referring to FIGS. 3A and 3B, an exemplary sensor system 200 includes a MEMS device 150. In at least one embodiment, MEMS device 150 uses capacitive sensing, i.e., MEMS device 150 generates an output signal (e.g., $V_O$) indicating a change in capacitance due to mechanical movement (i.e., displacement) of a proof mass with respect to a frame (e.g., package or substrate). In at least one embodiment of MEMS device 150, the capacitive displacement measurement is carried out using a sensing signal, which is an AC excitation signal having a frequency $f_{MOD}$ (e.g., 10 kHz<$f_{MOD}$<1 MHz) generated by frequency generator 208, and results in an output signal that is characterized by a small current at a high frequency. By measuring displacements using a frequency $f_{MOD}$ that is greater than a frequency $f_c$ (i.e., the frequency where flicker noise and 1/f noise have amplitudes equal to the amplitude of white noise), effects of low frequency noise on $V_O$ are reduced or eliminated. In at least one embodiment of system 200, a sensing amplifier 204 gains the output signal and provides the amplified output signal $V_{AMP}$ to a demodulator 206. Demodulator 206 band limits the energy of $V_{AMP}$ using band-pass filter 309 and demodulates the amplified output signal by multiplying the amplified output signal with the original excitation signal using a mixer to obtain a baseband signal $V_{SENSE}$ having voltage levels proportional to the displacement of the mass with respect to the frame. In at least one embodiment, a low-pass filter 311 is used to reduce or eliminate high-frequency components before delivering the signal to a signal processor or other load circuit, which is illustrated by a representative load having $R_{LOAD}$ and $C_{LOAD}$.

While the MEMS device described in FIG. 1 and modeled in FIGS. 2A and 2B is suitable for use as a resonator or as an acceleration sensor of FIGS. 3A and 3B, various types of MEMS devices can be adapted for use as magnetic sensors. Various embodiments of the invention exploit the interaction of magnetic fields on point charges. The Lorentz force describes the well-known relationship of the force on a point charge due to electromagnetic fields. Generally, the Lorentz force is described as $F=q[E+(v\times B)]$, where the vector E is the electric field, the vector B is the magnetic field, q is the electric charge, v is the velocity of the charged particle and × is the cross product. The magnetic force component alone is described as $F_{mag}=q(v\times B)$. That relationship can be exploited to utilize a MEMS device as a magnetic field sensor.

Figure 4A:
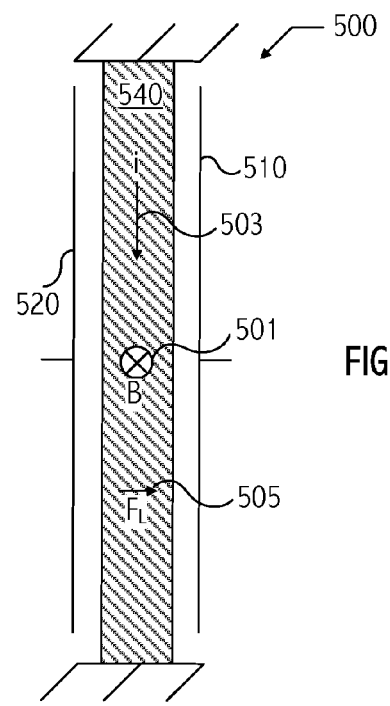
FIG. 4A illustrates directions of current flow and magnetic fields of a translational Lorentz-force magnetic sensor consistent with at least one embodiment of the invention.
Figure 4B:
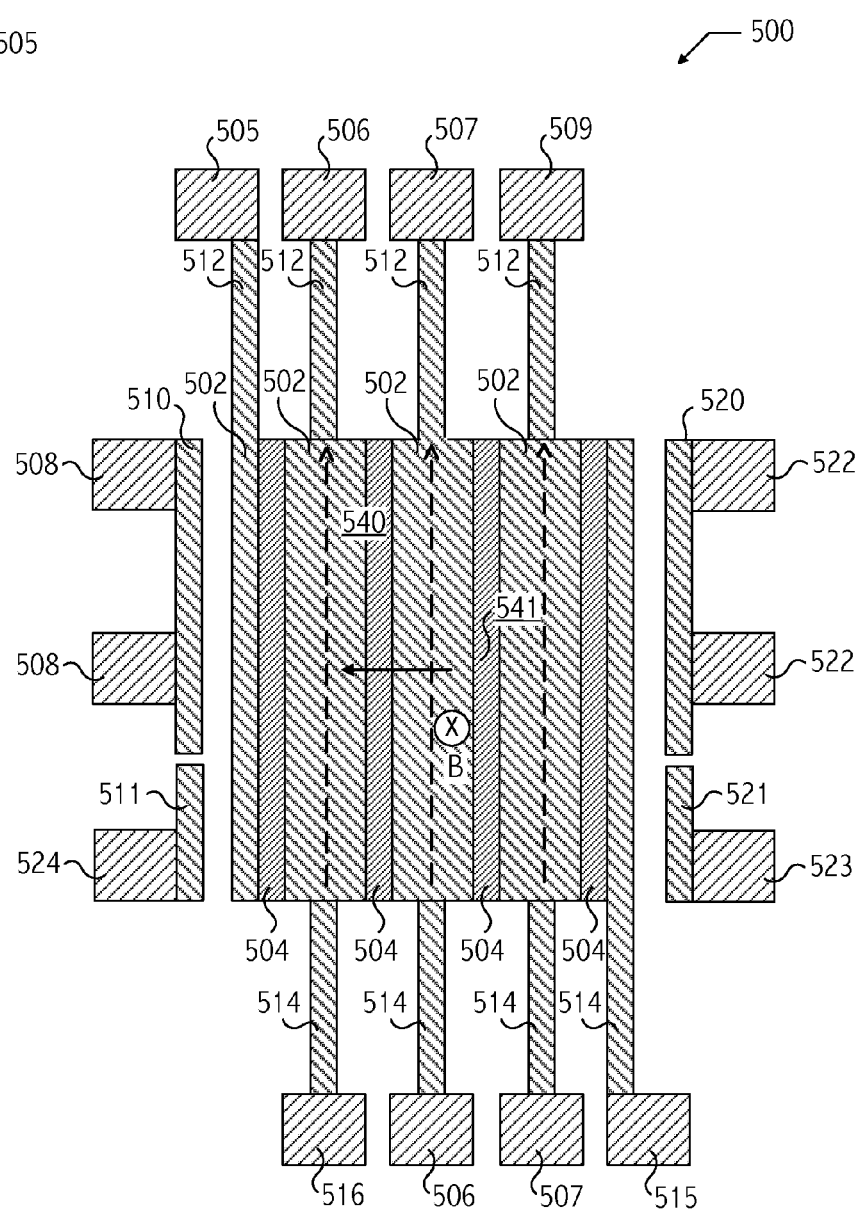
FIG. 4B illustrates a top view of a translational Lorentz-force magnetic sensor consistent with at least one embodiment of the invention.
Figure 4C:
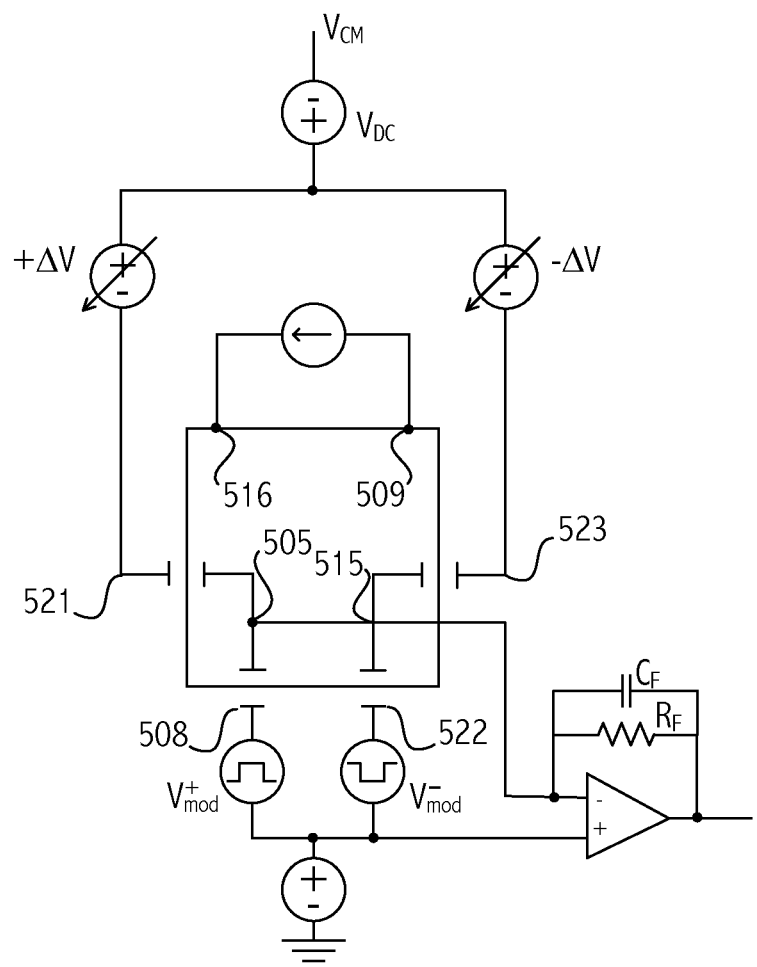
FIG. 4C illustrates an electrical representation of the translational Lorentz-force magnetic sensor of FIGS. 4A and 4B consistent with at least one embodiment of the invention.

Referring to FIGS. 4A-4C, illustrated is an exemplary embodiment of a MEMS magnetic sensor. MEMS magnetic sensor 500 uses electrostatic transducers (e.g., parallel plates with the drive or sense electrode as one plate and the movable mass as the other plate) to convert the movement of the mass 540 into an electrical signal. MEMS magnetic sensor 500 includes the mass 540, which is suspended from the substrate. Mass 540 is tied to springs 512 and 514, which are tied to anchored electrodes 505, 506, 507, 509, 515, and 516, which are in turn tied to the substrate below (not shown). Mass 540 may be formed of silicon germanium (SiGe) or other appropriate materials. Mass 540 is displaced in-plane in the manner described by the arrows 541 in response to a Lorentz force. Electrostatic transducers formed by mass 540 and plates 510 and 520 receive a differential sensing signal using electrodes 508 and 522. That sensing signal is used to sense the displacement of mass 540. Electrodes 505 and 515 supply an electrical signal corresponding to the mechanical motion of mass 540. Electrostatic transducers formed by mass 540 and plates 511 and 521 apply a force based on a differential signal received using electrodes 524 and 523 as part of a control loop circuit described later herein.

In addition, MEMS magnetic sensor includes a conductive path formed on the mass so current (shown as a dotted line) can flow along a surface of the mass. The conductive paths 502 are formed using oxide or other isolation layer 504 to isolate portions of the conductive material of the mass so as to form conductive paths 502 integral with the mass. In the particular illustrated embodiment, the conductive paths are formed of the same material as the other portions of the mass, but in other embodiments they may be formed of a different material on a surface of the mass. However formed, the conductive path is integral with the mass such that any force exerted on current flowing along the conductive paths is imparted to the mass to affect its position.

In the exemplary embodiment shown, the current enters the conductive path from electrode 516, which is tied through an interconnect to a current supply described later herein. In the illustrated embodiment, the current flows along the mass as shown by the dotted line, is interconnected (not shown) to the other conductive portions of mass 540. The current flows along the mass from electrode 516, through electrodes 506, which are coupled in other portions of the integrated circuit. The current flows along the mass from electrodes 506 to electrodes 507, which are coupled together in other portions of the integrated circuit. The current flows along the mass from electrodes 507 toward electrode 509, and exits through electrode 509 to a low impedance node such as ground. In the example shown, the current path is on the surface of the mass flowing in a vertical configuration. In other embodiments, isolation layers may be used to form one or more current paths in the mass that have other configurations. Note that while multiple current paths are shown, a single current path having other configuration can in fact be formed on the mass with appropriately formed isolation material to route the current. Additional isolation layers may be utilized in the embodiment shown in FIG. 4B to maintain mass at appropriate potentials. Note that the current paths along the mass are orthogonal to the direction of mass displacement, which is in a horizontal direction in the illustrated embodiment. MEMS magnetic sensor 500 is exemplary only, and other magnetic sensors may be used, e.g., magnetic sensors described in U.S. patent application Ser. No. 13/174,417, entitled "MEMS-Based Magnetic Sensor with a Lorentz Force Actuator Used as Force Feedback," naming Emmanuel P. Quevy as inventor, filed Jun. 30, 2011, which application is incorporated herein by reference.

When the MEMS magnetic sensor 500 is in the presence of a magnetic field 501 orthogonal to both the direction of current flow and the direction of free motion of mass 540, a force is imparted on mass 540 due to the Lorentz force interacting with the point charges of the current thereby causing the position of the mass to change, which change will be sensed by the output transducer. The force due to the magnetic field is described as $F_L=Ni1\times B$, where N is the number of parallel conductors in the coil, the vector B is the magnetic field, i is the current, l is a vector, having a magnitude that is the length of the conductor, and a direction that is along the conductor, aligned with the direction of conventional current flow, and x is the cross product. Assuming the magnetic field 501 in a direction along the z-axis into the page, the Lorentz force is the cross product as stated above. The current flows vertically, along the y-axis. The Lorentz force therefore exerts a force illustrated by arrows 541 on the current flowing in the conductive path of mass 540. That force displaces mass 540 horizontally along the x-axis (e.g., in a negative direction). The amount of displacement is dependent on factors such as the strength of the magnetic field, the current, and the number of current paths in the MEMS device. Given a magnetic field such as the earth's magnetic field, sufficient force will be imparted to affect the mass position and thereby detect the field.

Figure 5A:
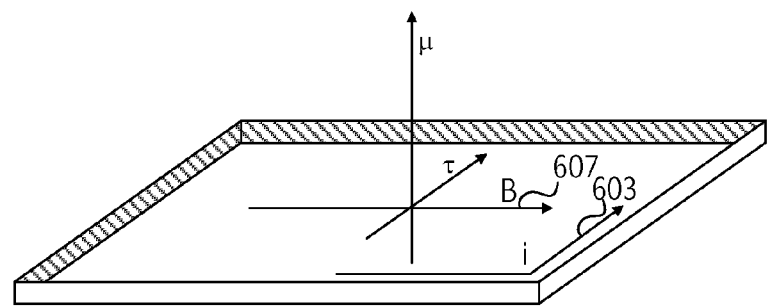
FIG. 5A illustrates directions of current flow and magnetic fields of a torsional Lorentz-force magnetic sensor consistent with at least one embodiment of the invention.
Figure 5B:
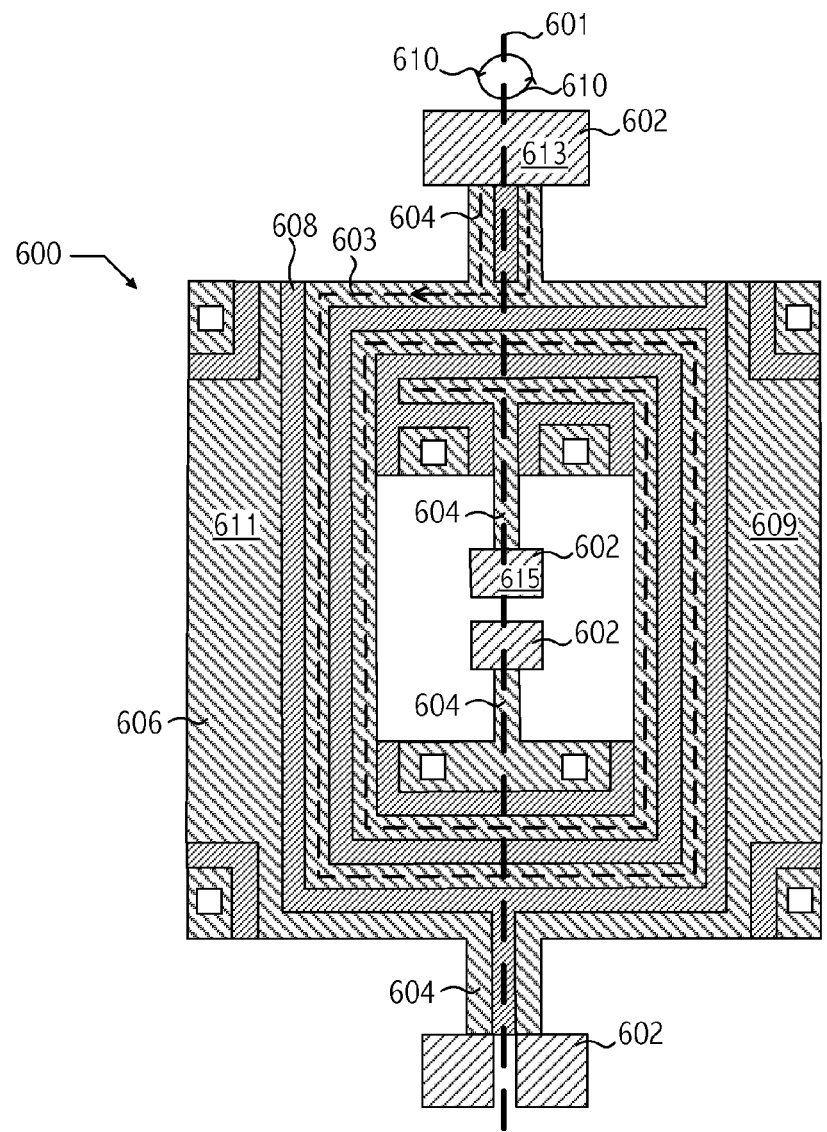
FIG. 5B illustrates a top view of a torsional Lorentz-force magnetic sensor consistent with at least one embodiment of the invention.

FIGS. 5A and 5B illustrate top views of MEMS magnetic sensor 600 detecting torsional motion around central axis 601. MEMS magnetic sensor 600 uses electrostatic transducers to convert the torsional displacement of mass frame 606 around axis 601 of the MEMS device to an electrical signal. MEMS magnetic sensor 600 includes the mass 606 tied to torsional springs 604, which are tied to anchors 602, which are in turn tied to the substrate below (not shown). The mass may be formed of silicon germanium (SiGe) or other appropriate materials. When the MEMS magnetic sensor 600 is in the presence of a magnetic field having a component along a surface of sensor 600, a force is imparted on mass frame 606 due to the Lorentz force interacting with the point charges of the current thereby causing torsion of the mass frame to change the position of plate portions 609 and 611, which change will be sensed by output transducers. The torque induced by the magnetic field is described as $\tau_L=\mu\times B$, where $\mu$ is the magnetic moment that results from the circular flow of current in a loop, x is the cross product, and the vector B is the magnetic field. The magnitude of $\mu$ is NiA, where N is the number of loops in the conductor, i is the current, and A is the area enclosed by the loop. The direction of $\mu$ is normal to the plane of the conducting loop, with the direction defined by the right-hand rule where fingers curl in the direction of loop current and the thumb points in the direction of $\mu$. Electrostatic transducers utilize a sense electrode formed by plate portion 609 and another plate above or underneath (not shown) and plate portion 611 and another plate above or underneath (not shown). Those electrostatic transducers sense the torsional displacement to supply an electrical signal corresponding to the mechanical motion, to a control loop circuit described later herein.

MEMS magnetic sensor 600 includes a conductive path formed on mass frame 606 so a current (shown as dotted line 604) can flow along a surface of the mass. The conductive path is formed using oxide or other isolation layer 608 to isolate portions of the conductive material of the mass so as to form a conductive path integral with the mass. In the particular illustrated embodiment, the conductive path is formed of the same material as the other portions of the mass, but in other embodiments it may be formed of a different material on a surface of the mass. However formed, the conductive path is integral with the mass such that any force exerted on the current flowing along the conductive path is imparted to the mass to affect its position.

In MEMS magnetic sensor 600, the current enters the conductive path at anchor 613, which is tied through an interconnect to a current supply described later herein. In the illustrated embodiment, the current flows along the mass as shown by the dotted line, and exits through the anchor 615 to a low impedance node such as ground. In the example shown, the current path is on the surface of the mass in a counterclockwise configuration. Additional isolation layers may be utilized in the embodiment shown in FIG. 5B to maintain mass at appropriate potentials. Other portions of magnetic sensor 600 are biased at appropriate potentials.

Note that MEMS magnetic sensors 500 and 600 of FIGS. 5A-6B are exemplary only. In other embodiments, the MEMS magnetic sensor has other geometries and isolation layers may be used to form one or more current paths in the mass that have other configurations. In general, a MEMS magnetic sensor device has a force noise proportional to $\sqrt{m}$, where m is mass and the signal-to-noise ratio (SNR) when sensing the magnetic field is proportional to $$\frac{1}{\sqrt{m}}.$$

In contrast, when sensing acceleration, the acceleration noise is proportional to $$\frac{1}{\sqrt{m}}.$$

and the SNR is proportional to $\sqrt{m}$. Therefore, in general, MEMS devices designed for magnetic sensing applications may be designed to have an amount of mass that is less than the amount of mass targeted for MEMS devices designed for accelerometer or gyroscope applications.

Figure 6A:
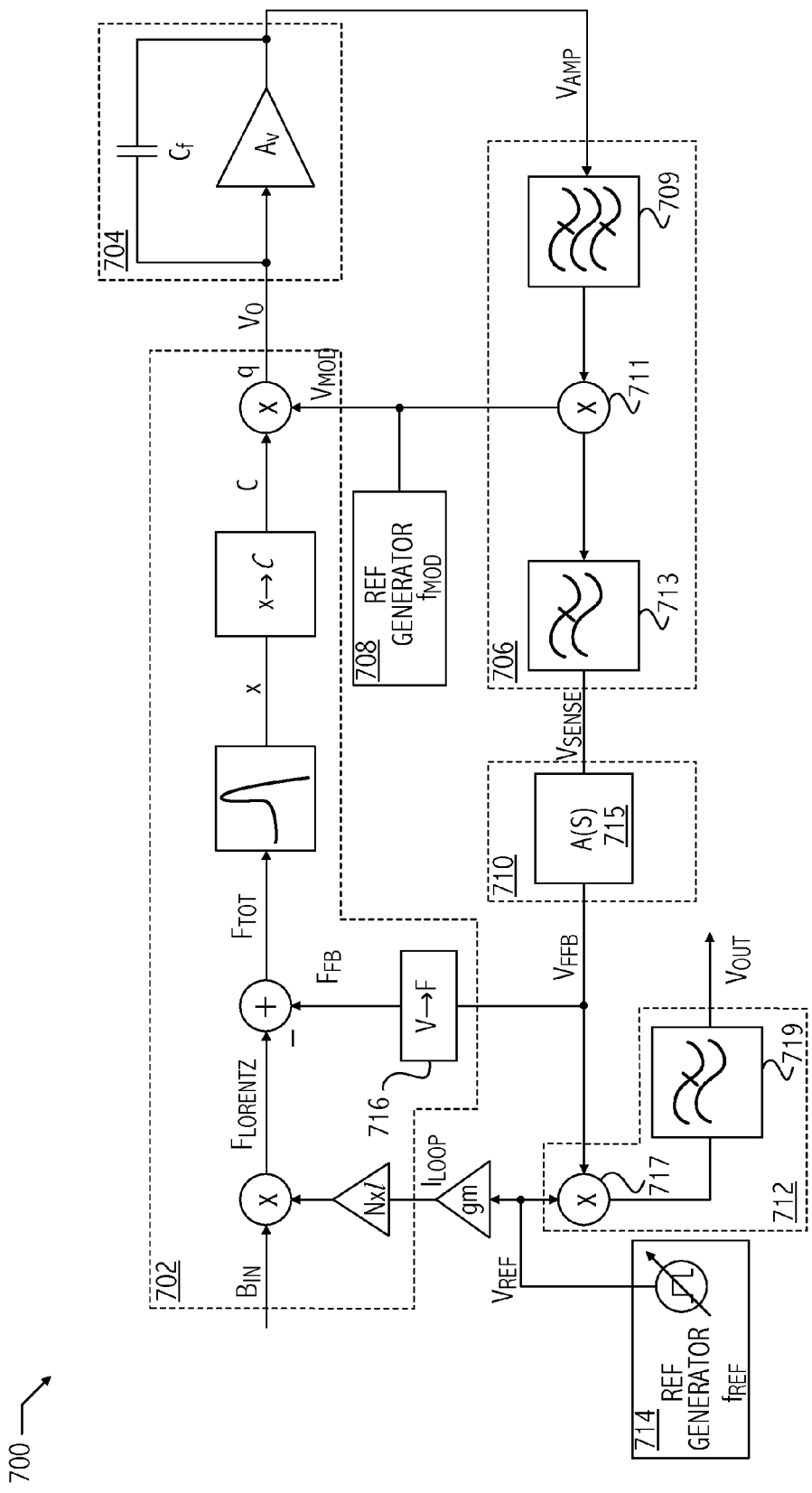
FIG. 6A illustrates a functional block diagram of aspects of a Lorentz-force magnetic sensor configured in a force-feedback control loop consistent with at least one embodiment of the invention.
Figure 6B:
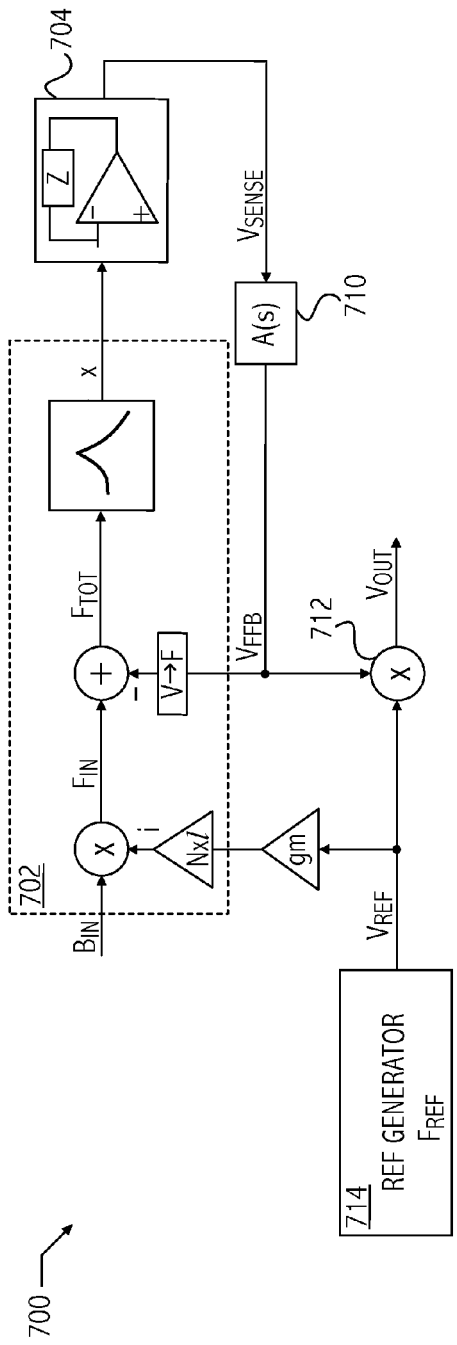
FIG. 6B illustrates another representation of the Lorentz-force magnetic sensor of FIG. 6A.

Referring to FIG. 6A and FIG. 6B, which is a simplified representation of the system of FIG. 6A, a technique for measuring the strength of a magnetic field incorporates a MEMS device 702 in a control loop that generates force-feedback control voltage $V_{FFB}$ based on sensed displacements of a mass of MEMS device 702 with respect to the frame of MEMS device 702. MEMS magnetic sensor 702 receives a time-varying current, $I_{LOOP}$, from reference generator 714 and having a frequency $f_{REF}$. That current travels through N segments on a mass of MEMS device 702. A magnetic field interacting with the point charges of current flowing through the mass imparts a force on the mass to change the position of the mass. Controller 710 generates force-feedback control voltage $V_{FFB}$ that is configured to control transducer 716 of MEMS device 702 to apply a feedback force $F_{FB}$ to the mass of MEMS device 702 to constrain a range of motion of the mass. In at least one embodiment of system 700, that feedback force is effectively equal and opposite to the Lorentz force. Thus, the application of the force-feedback control voltage $V_{FFB}$ is proportional to the sensed displacements and compensates for movements in response to that magnetic field to thereby maintain the mass in a stationary position. The control loop creates a nulling force that compensates for the Lorentz force acting on the mass. The desired output is derived from the feedback voltage, $V_{FFB}$, and is proportional to the magnetic force acting on the mass.

In general, since a current flowing through a MEMS magnetic sensor multiplies the magnetic field to produce a Lorentz force, modulation of the current at the resonant frequency of the MEMS magnetic sensor ($f_{O\_MEMS}$) will produce a Lorentz force that is translated in frequency by $f_{O\_MEMS}$. A DC magnetic field will produce a Lorentz force at $f_{O\_MEMS}$, which is where the MEMS sensor has maximum gain. Thus, MEMS device 702 is most sensitive at frequencies around the resonant frequency of the MEMS device (i.e., $f_{O\_MEMS}$) with a relatively narrow bandwidth (e.g., approximately 100 Hz). That is, MEMS device 702 applies the highest gain to sensed displacements having frequencies in a narrow range around $f_{O\_MEMS}$. Accordingly, $I_{MEMS}$ applied to MEMS device 702 is frequency-locked to the resonant frequency of MEMS device 702. Reference generator 714 generates a signal having a frequency that is approximately matched to the resonant frequency of the moving conductors on the MEMS device 702 and the corresponding current, $I_{MEMS}$, is provided to the conductive elements on MEMS device 702. In the presence of a magnetic field $B_{IN}$ that points parallel to the plane of the current loop, a Lorentz force displaces the mass of MEMS device 702. A sense capacitor generates the output voltage $V_O$ proportional to a motional current that indicates a rate of change of capacitance of the sense capacitor of MEMS device 702. In at least one embodiment of system 700, MEMS device 702 receives an AC excitation signal having a frequency $f_{MOD}$, as described above with reference to FIGS. 3A and 3B. A sensing amplifier 704 gains that output voltage and provides the amplified output signal to a demodulator, which in an embodiment, includes a bandpass filter 709 having a pass band centered around $f_{MOD}$ to limit the frequency band of the amplified signal. Demodulator 711 demodulates the amplified output signal (e.g., by multiplying the amplified output signal with the original excitation signal using a mixer) to obtain a signal, $V_{SENSE}$, having voltage levels proportional to the displacement of the mass with respect to the frame. In at least one embodiment, a low-pass filter 713 reduces or eliminates high-frequency components before delivering the signal $V_{SENSE}$ to controller 710.

In at least one embodiment, controller 710 includes a proportional-integral-derivative controller (e.g., A(s) controller 715), which can be configured using set points to reduce or eliminate error by generating a force-feedback voltage $V_{FFB}$ based on a weighted sum of present, past, and future errors in response to a current rate of change, as is well-known in the art. Transducer 716 converts the force-feedback voltage to a force applied to a MEMS device 702 to change the displacement of the mass. Controller 710 can be configured to implement a force-feedback configuration that compensates for any displacement of the mass with respect to the frame of MEMS device 702. In at least one embodiment, controller 710 includes a band-pass filter that restricts the energy of the control signal to a narrow frequency band centered around $f_{O\_MEMS}$. That bandlimited control signal generated by controller 710 is provided to MEMS 702, which exerts a force on the mass to compensate for the Lorentz force in response to the control signal. In addition, the control signal output generated by controller 710 is demodulated by demodulator 717 using the reference signal generated by reference generator 714 to thereby recover a signal indicative of the magnetic field incident on MEMS device 702. Use of the same signal to sense/modulate the magnetic field and demodulate the sensed magnetic field reduces or eliminates long-term noise components. In addition, since MEMS device 702 is not self-resonating, noise introduced by resonance is eliminated. The noise generated by MEMS device 702 is scaled by the signal. By limiting movement of the mass using force-feedback control, MEMS device 702 can be implemented using relatively small capacitive gaps for sensing motion of the resonator. For example, the capacitive gaps in a MEMS device 702 that is not configured to resonate can be smaller than the capacitive gaps used in a MEMS device 702 that is configured to resonate.

Figure 6C:
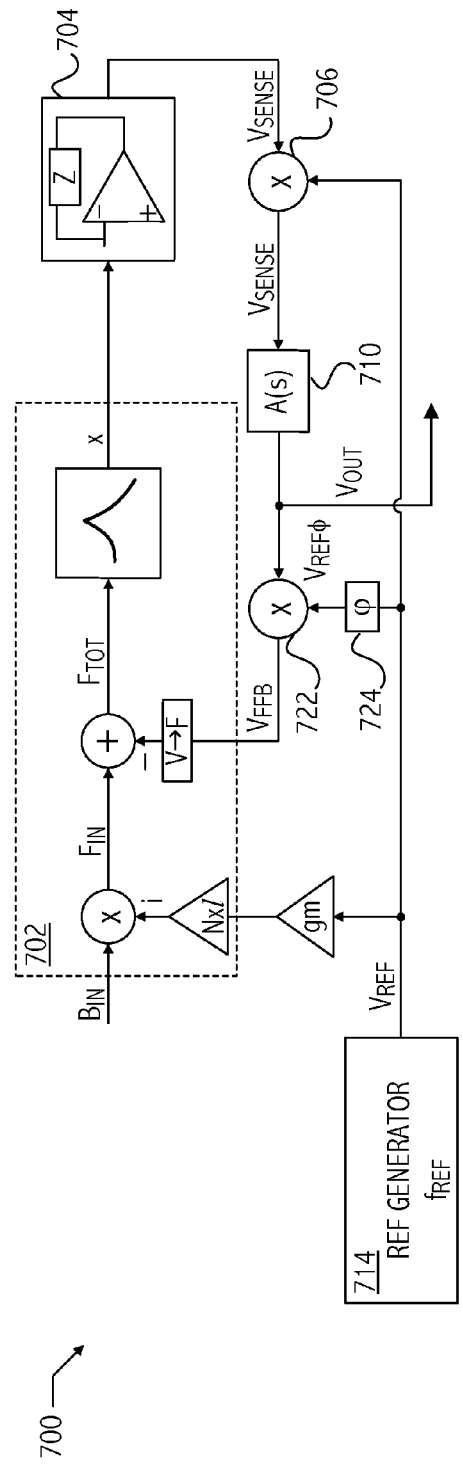
FIG. 6C illustrates a functional block diagram of another embodiment of a Lorentz-force magnetic sensor configured in a force-feedback control loop consistent with at least one embodiment of the invention.

FIG. 6C illustrates another embodiment of a MEMS magnetometer in which the sensed voltage, $V_{SENSE}$, is demodulated using the reference signal generated by reference generator 714 prior to generating the force-feedback control signal. For example, mixer 706 demodulates the sensed voltage $V_{SENSE}$, using the reference signal, $V_{REF}$, generated by reference generator 714. That demodulated version of $V_{SENSE}$, $V_{SENSEDM}$) is then provided to controller 710. Mixer 722 then modulates the output of controller 710 with the output of phase shifter 724, which is a phase-shifted version of that reference signal (e.g., $V_{REF\Phi}$) to generate the force-feedback signal having a frequency component centered around $f_{O\_MEMS}$. In addition, in the embodiment of FIG. 6C, the output of controller 710 is a baseband signal indicative of the magnetic field incident on MEMS device 702 and is provided as the output signal. This two-mixer approach allows simplification of controller 710, by eliminating the need for controller 710 to band-limit the control signal before it is provided to MEMS device 702 and only requires use of a low-pass filter (not shown) before controller 710. Thus, unlike in the configuration of FIG. 6A, which uses bandpass filter 709, $V_{FFB}$ tracks changes in the resonant frequency of the MEMS device to the extent that $f_{REF}$ tracks the resonant frequency of the MEMS device. Moreover, the technique of FIG. 6C introduces an additional phase shift to system 700 and only applies feedback over a narrow frequency band around $f_{REF}$, which provides an additional degree of freedom in determining the stability of system 700 in FIG. 6C as compared to the stability of the configurations of FIGS. 6A and 6B.

The resonant frequency of a manufactured MEMS device can vary from a design target resonant frequency as a result of variations in manufacturing process and/or environmental factors. Similarly, manufacturing process and/or environmental factors may independently cause frequency of the signal generated by a reference signal generator to vary from a target frequency. Thus, the reference signal frequency ($f_{REF}$) may not be approximately equal to the resonant frequency of the MEMS device ($f_{O\_MEMS}$) in a manufactured magnetometer. The difference in those frequencies reduces the Q-enhanced movement of the mass in response to the Lorentz force. Accordingly, system 700 may be implemented using techniques to match the frequency of a reference clock signal and the resonant frequency of MEMS device 702 after manufacture, thereby locking the frequency of the current in the coil to the resonant frequency of MEMS device 702. FIGS. 7A-7E illustrate various techniques for generating the reference signal, $V_{REF}$, which is a time-varying signal having a frequency, $f_{REF}$, that is matched to $f_{O\_MEMS}$, the resonant frequency of MEMS device 702.

Figure 7A:
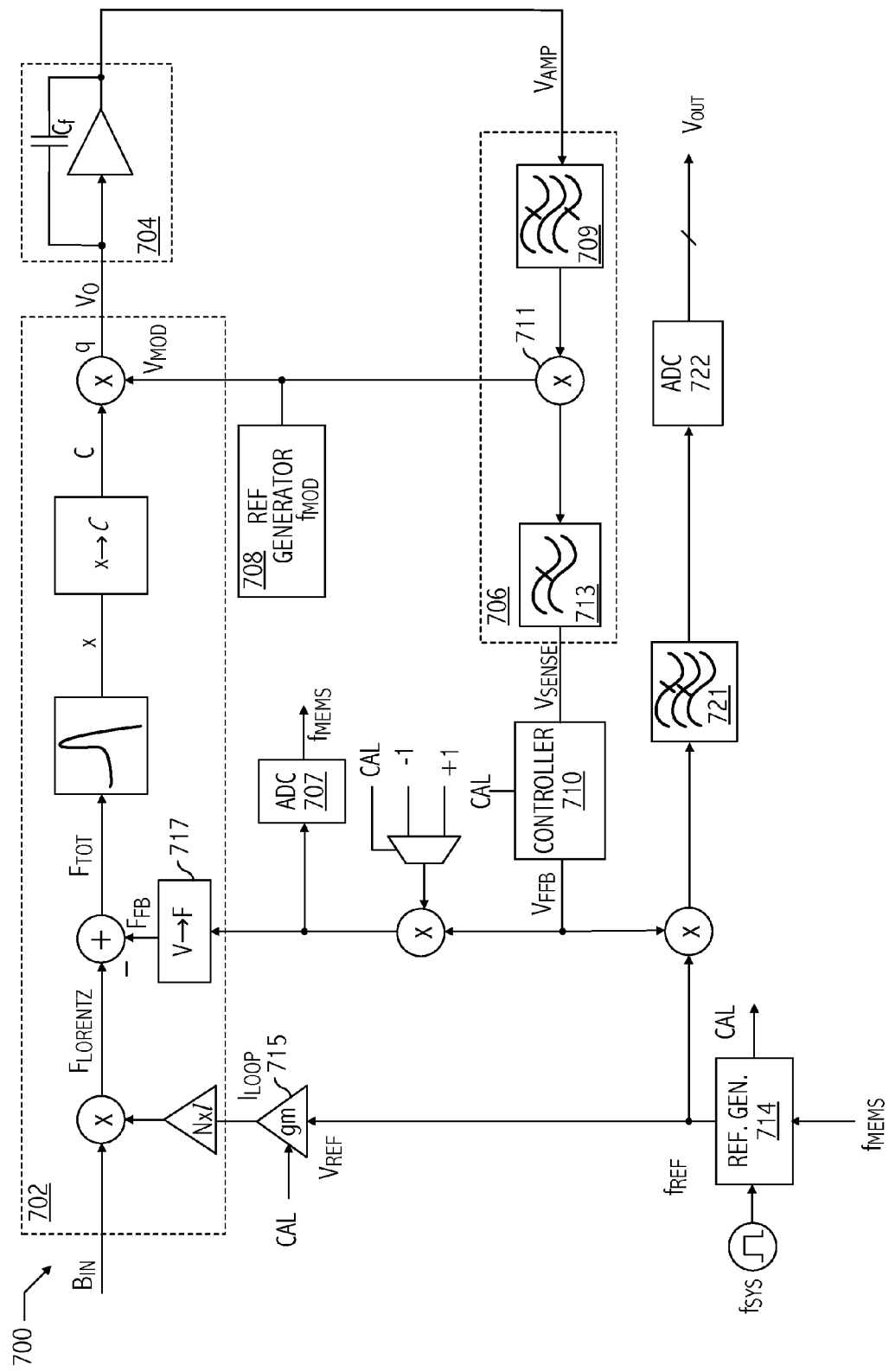
FIG. 7A illustrates a functional block diagram of the Lorentz-force magnetic sensor configured in a force-feedback control loop of FIG. 6A including a digital phase-locked-loop reference generator consistent with at least one embodiment of the invention.
Figure 7B:
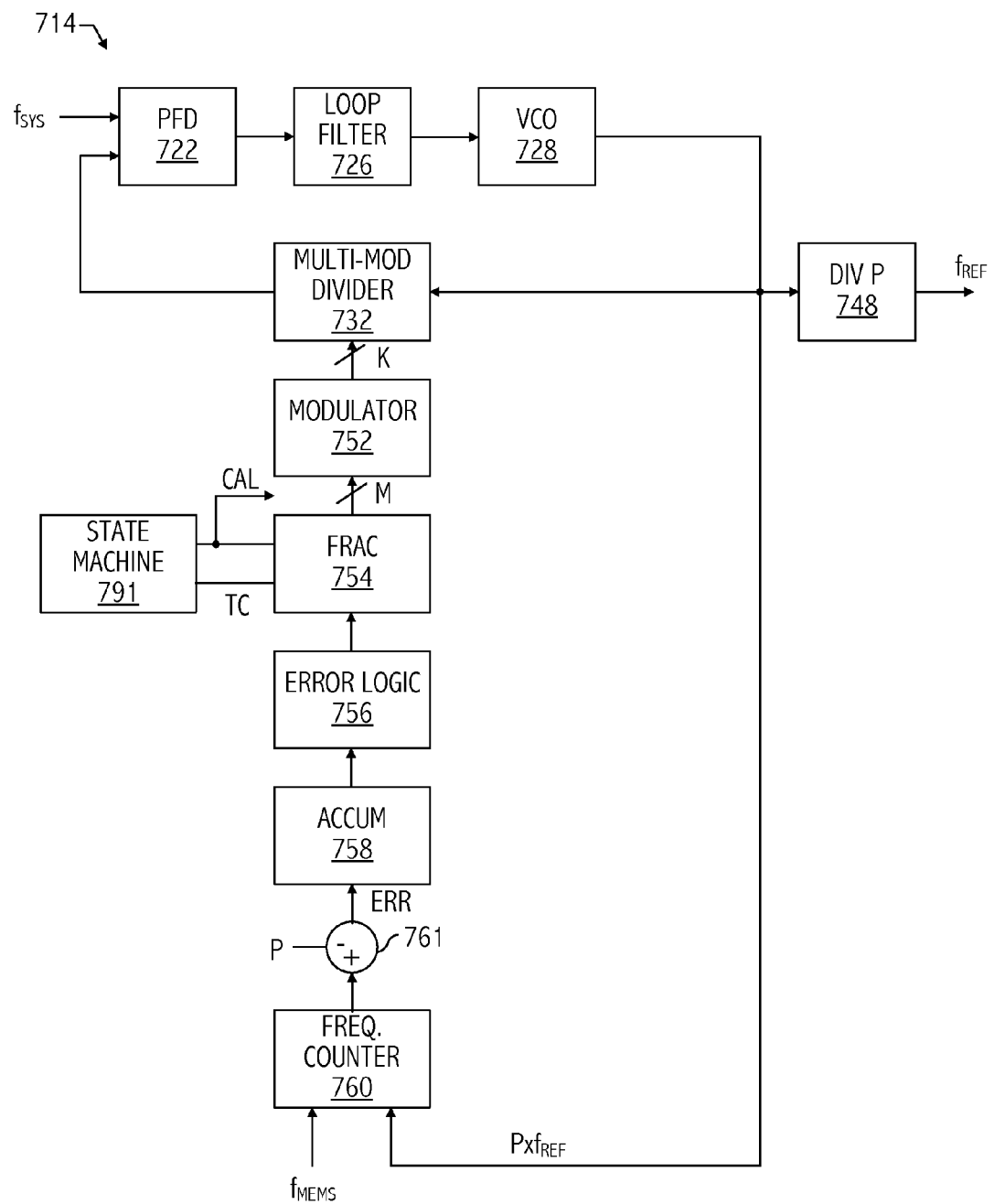
FIG. 7B illustrates a functional block diagram of the digital phase-locked loop reference generator of FIG. 7A consistent with at least one embodiment of the invention.

Referring to FIGS. 7A and 7B, a technique for matching the frequency of the reference signal to the resonant frequency of MEMS device 702 includes two modes of operating system 700: a calibration mode and a magnetometer mode. State machine 791 selects the mode of operating system 700, e.g., by asserting a control signal CAL to configure system 700 in a calibration mode. In the calibration mode, MEMS device 702 is configured to resonate and no time-varying current is provided (i.e., $I_{LOOP}=0$, e.g., by disabling voltage-to-current converter 715 in calibration mode) to MEMS device 702. In calibration mode, the output of controller 710 is applied as positive feedback causing the MEMS device 702 to oscillate at its resonant frequency $f_{O\_MEMS}$. Analog-to-digital converter 707 converts that positive feedback signal to a digital signal and provides it to reference generator circuit 714, as a signal having a frequency of $f_{MEMS}$, which is indicative of the MEMS frequency of oscillation. In calibration mode, gain of controller 710 may be adjusted to speed up the calibration process.

During the calibration mode, reference generator 714 is configured to determine one or more control settings for use in the magnetometer mode. Those control settings will be used to generate a reference signal having a frequency that matches $f_{O\_MEMS}$. For example, reference generator 714 uses those control signals to lock the frequency of a voltage-controlled oscillator (VCO) 728 of a fractional-N phase-locked loop to the resonant frequency of MEMS device 702. Voltage controlled oscillator 728 is designed to generate an oscillating signal having a frequency that is close to an integer P times a design target for the resonant frequency of MEMS device 702. Voltage-controlled oscillator 728 is included in a phase-locked loop (PLL) circuit including phase detector 722, loop filter 726 and divider 732. During the calibration mode, another control loop adjusts an M-bit fractional divide value that is stored in FRAC 754 and is updated until the frequency-divided output of divider 748 is equal to frequency $f_{MEMS}$ coming from the MEMS resonator when configured in calibration mode.

In at least one embodiment of the control loop that generates the M-bit fractional divide value, frequency counter 760 counts event frequency of the signal generated by VCO 728 (e.g., having a frequency of $P \times f_{REF}$) with respect to event frequency of $f_{MEMS}$. Digital circuit 761 subtracts the predetermined divide value P from the output of frequency counter 760 and provides the difference to accumulator 758. When the frequency of the signal generated by VCO 728 matches P times the frequency of $f_{MEMS}$, the output error provided to accumulator 758 is approximately zero. Otherwise a non-zero error signal indicates the frequency error, which is provided to accumulator 758. Error logic 756 uses an accumulated error signal to generate a fractional divide value that is used by the phase-locked loop to adjust the frequency of the output of VCO 728 to lock $P \times f_{REF}$ to $P \times f_{MEMS}$. In at least one embodiment of the calibration mode, reference generator 714 also implements an open-loop temperature compensation technique that determines and stores temperature coefficients. Those predetermined temperature coefficients may be applied to the fractional divider value or other system parameters used in the magnetometer mode to generate the reference signal having a frequency matched to $f_{O\_MEMS}$.

At the end of the calibration mode, which is long enough for the PLL of reference generator 714 to lock $P \times f_{REF}$ to $P \times f_{MEMS}$, one or more associated control signals are stored for later use during the magnetometer mode. For example, FRAC 754 stores an M-bit fractional divider value. During magnetometer mode, the contents of FRAC 754 are not updated and the stored M-bit fractional divider value is provided to delta-sigma modulator 752, which provides a stream of K-bit divide values (where K<M) to multi-modulus divider 732 to implement an effective divide value that approximates the stored fractional divider value. As a result, in magnetometer mode, VCO 728 generates a signal having a frequency that achieves a predetermined ratio (P) with respect to the resonant frequency of MEMS 702. Accordingly, frequency divider 748 frequency divides by P to generate a signal $f_{REF}$ that has a frequency matched to the resonant frequency of MEMS device 702.

Figure 7C:
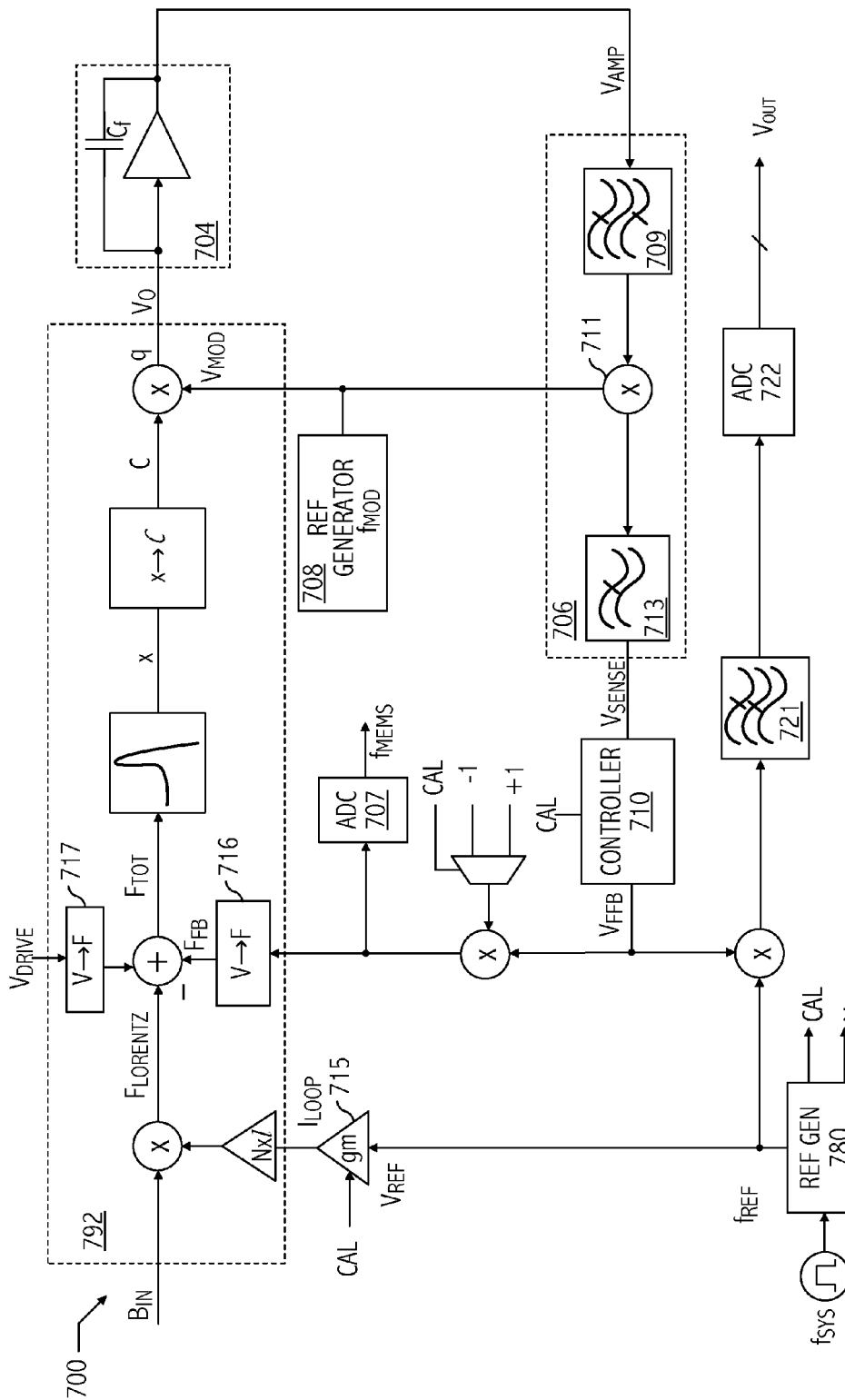
FIG. 7C illustrates a functional block diagram of a Lorentz-force magnetic sensor configured in a force-feedback control loop including a reference generator and a MEMS device including an additional transducer consistent with at least one embodiment of the invention.
Figure 7D:
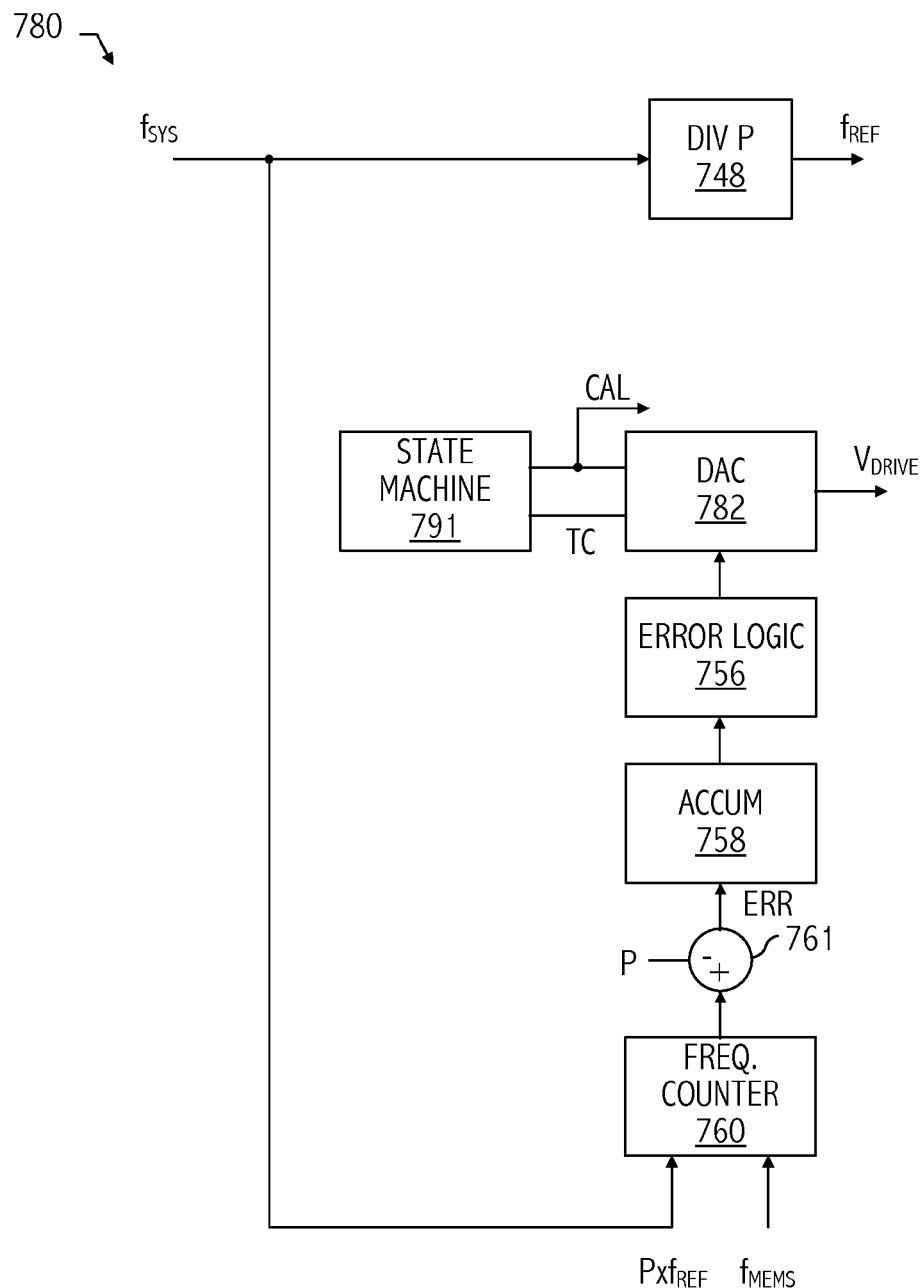
FIG. 7D illustrates a functional block diagram of the reference generator of FIG. 7C consistent with at least one embodiment of the invention.

Rather than generating the reference signal using a PLL including VCO 728, as illustrated in FIG. 7B, another technique for matching the frequency of a reference signal and the resonant frequency of a MEMS device in a magnetometer mode after manufacturing, matches those frequencies by adjusting the resonant frequency of a MEMS device itself. Referring to FIGS. 7C and 7D, MEMS device 792, which is otherwise the same a MEMS device 702 but for an additional voltage-to-force transducer 717 that applies a force to MEMS device 792 in response to a signal $V_{DRIVE}$. The $V_{DRIVE}$ signal causes transducer 717 to pull the resonant frequency $f_{O\_MEMS}$ to match the frequency of the reference signal, $f_{REF}$. Reference generator 780 includes frequency divider 748 that frequency-divides, by predetermined value P, a signal provided by an available reference clock (e.g., a high-frequency system clock available on an integrated circuit including system 700) to generate a signal having a frequency $f_{REF}$ in the range of the target resonant frequency of MEMS device 792. Note that in other embodiments of reference generator 780, the system clock signal itself, rather than a frequency-divided signal having a frequency $f_{REF}$, has a frequency $f_{SYS}$ in the range of the target resonant frequency of MEMS device 792. In those embodiments, the control loop of reference generator 780 matches the frequency of the system clock signal and the resonant frequency of MEMS device 792 and divider 748 is excluded. Reference generator 780 uses calibration techniques described above to determine the error between $f_{REF}$ and the resonant frequency of MEMS device 792 and stores a corresponding digital value that is converted to $V_{DRIVE}$.

Figure 7E:
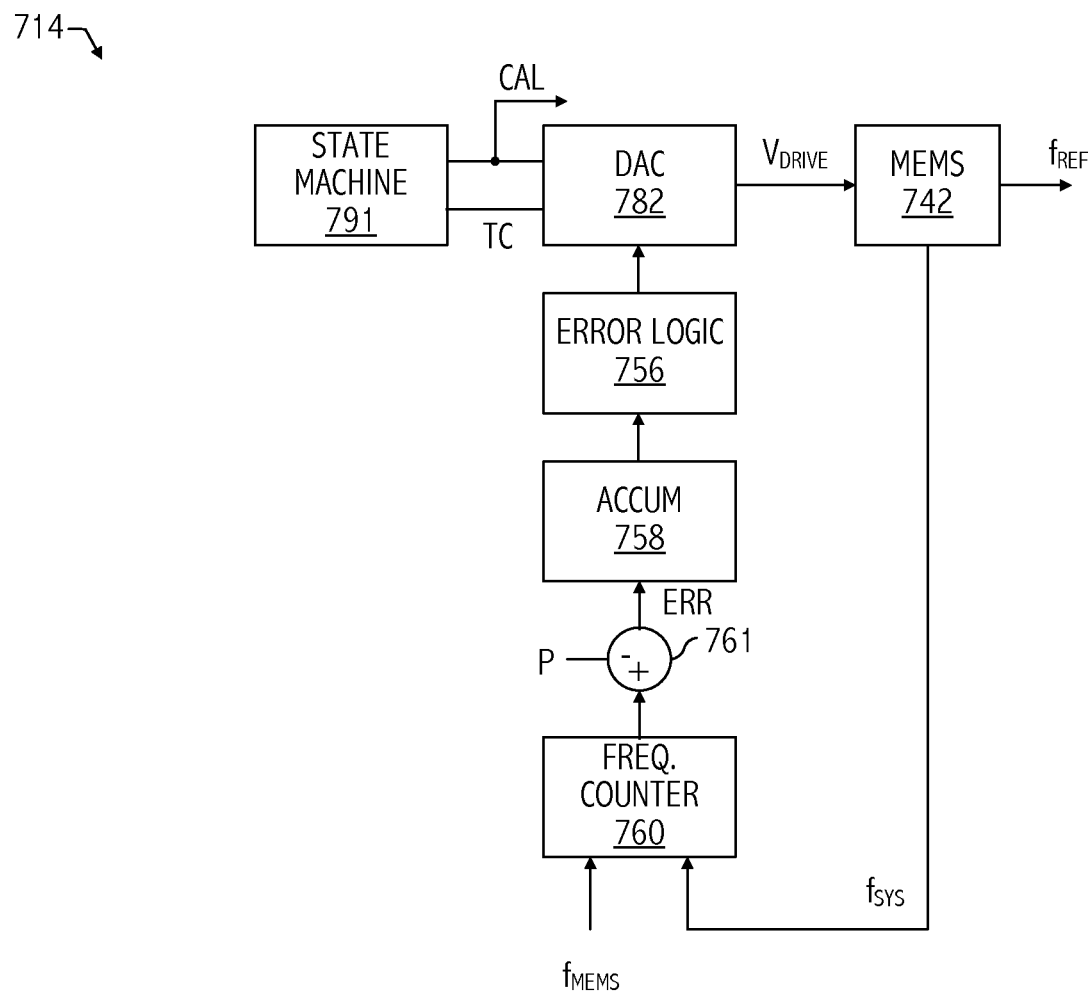
FIG. 7E illustrates a functional block diagram of another embodiment of a reference generator of FIG. 7A including a replica MEMS device consistent with at least one embodiment of the invention.

In the implementations of FIGS. 7A, 7B, 7C, and 7D, the clock that generates a signal with frequency $f_{SYS}$ may be a relatively high-frequency oscillator that may be implemented at a relatively low cost (e.g., relatively small area) using resistors and capacitors. The high-frequency reference clock signal may be frequency-divided down using divider 748 and then after manufacture, the frequencies of the high-frequency oscillator and the resonant frequency of MEMS device 702 are matched. Referring to FIGS. 7A and 7E, another technique for locking the frequency of the reference clock signal and the resonant frequency of MEMS device 702 includes duplicating MEMS device 702 in another MEMS device 742 that is configured as a resonator to generate the reference clock signal. The resonant frequency of the duplicate MEMS device is substantially the same as MEMS device 702. Any difference in the two resonant frequencies may be detected using calibration techniques described above with respect to FIGS. 7A and 7B. An indicator of the difference between the two frequencies determined during calibration generated by error logic 756 is stored in DAC 782 for conversion to the analog drive voltage, $V_{DRIVE}$, which is used by an actuator of MEMS device 742 to apply a force on MEMS device 742. That force adjusts the resonant frequency of MEMS device 742 to match the resonant frequency of MEMS device 702, resulting in the frequency of the time varying current of the magnetometer matching the resonant frequency of MEMS device 742, which generates the reference signal.

Figure 8A:
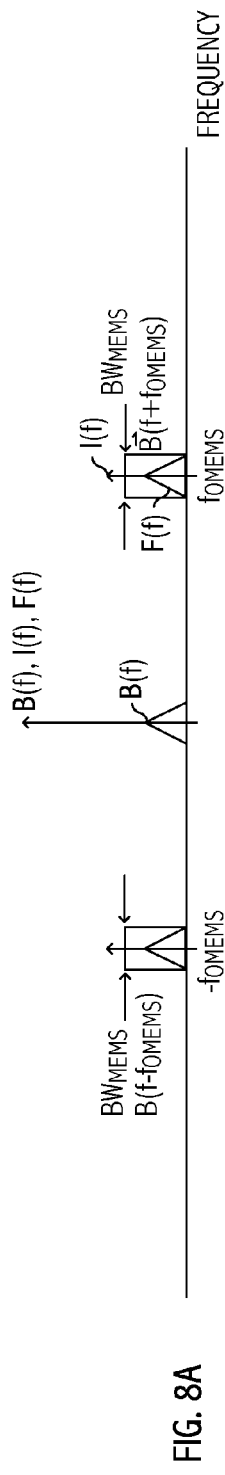
FIG. 8A illustrates sensed magnetic fields as a function of frequency sensed using a Lorentz-force magnetic sensor consistent with at least one embodiment of the invention.

In general, embodiments of the MEMS magnetometer described above sense DC or low bandwidth magnetic fields (e.g., magnetic fields of a permanent magnet or the geomagnetic field). As discussed above, the MEMS magnetometer modulates the current in the suspended mass at a frequency $f_{REF}$ that is set equal to the MEMS sensor resonant frequency $f_{MEMS}$ during calibration. When the current in the movable mass encounters a DC magnetic field, a Lorentz force is created that is centered at $f_{REF} \approx f_{MEMS}$. The MEMS magnetometer has a narrow bandwidth around $f_{MEMS}$, in which it is sensitive to the Lorentz force as illustrated in FIG. 8A.

However, a magnetic field to be sensed by the sensor may have a bandwidth that is wider than the MEMS resonator bandwidth. Accordingly, embodiments of the MEMS magnetometer may be used as a magnetic spectrum analyzer by varying the frequency of the current generated by the reference generator used to modulate the Lorentz force. Thus, the broad frequency spectrum of the magnetic field to be sensed can be selectively translated into a Lorentz force centered at a peak sensitivity spectrum of the MEMS resonator. As the system sweeps the frequency of the current in the moving mass, the system will sweep the resulting Lorentz force through the $f_{MEMS}$ resonant frequency. The sweeping of the measured Lorentz force frequency through the sensitive narrowband region of the MEMS resonator is analogous to the way a local oscillator is used in conjunction with a mixer to sweep a signal to be measured through the narrow bandwidth of a filter in a spectrum analyzer.

Figure 8B:
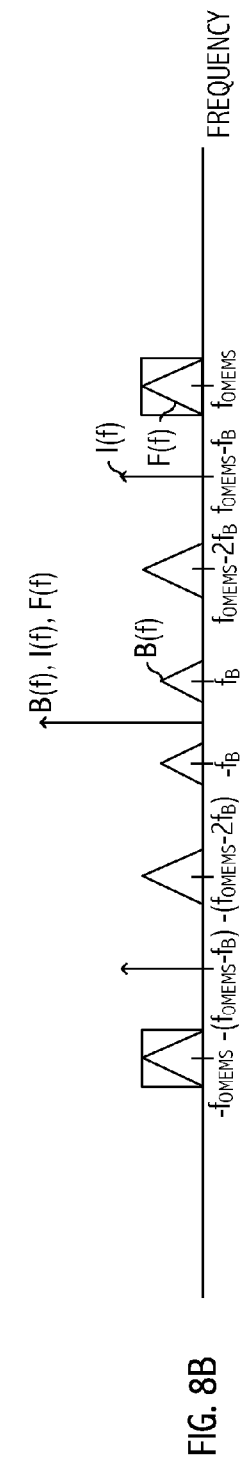
FIG. 8B illustrates sensed magnetic fields as a function of frequency for a Lorentz-force magnetic sensor receiving a current that varies from the resonant frequency of the MEMS device consistent with at least one embodiment of the invention.
Figure 8C:
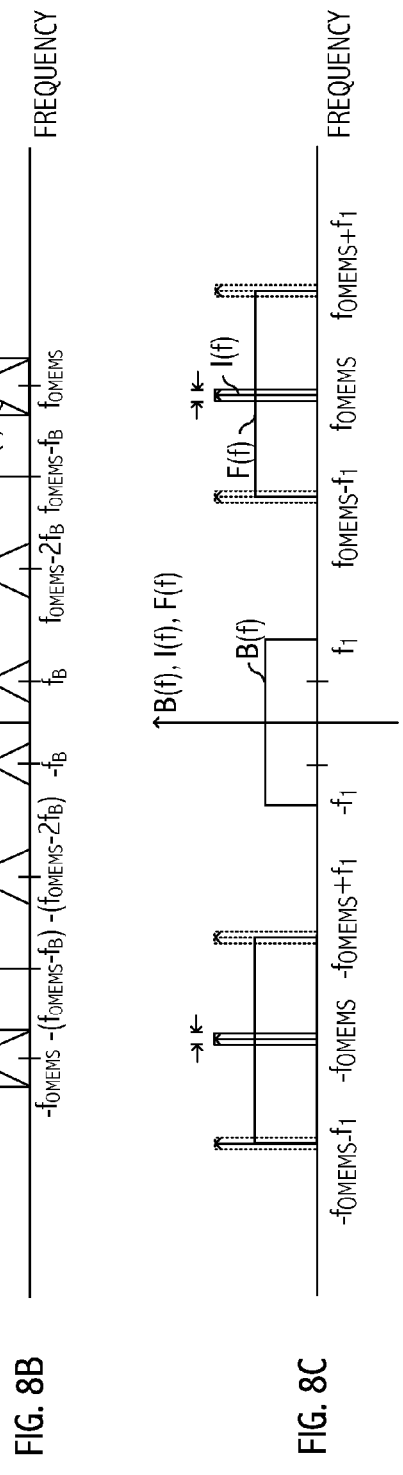
FIG. 8C illustrates sensed magnetic fields as a function of frequency for a Lorentz-force magnetic sensor configured as a magnetic spectrometer consistent with at least one embodiment of the invention.
Figure 8D:
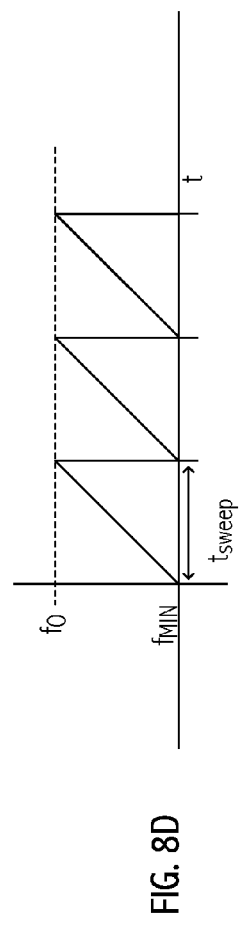
FIG. 8D illustrates frequency as a function of time for current of a reference generator of a Lorentz-force magnetic sensor consistent with at least one embodiment of the invention.

For example, referring back to FIG. 7A, reference generator 714 introduces a frequency offset from $f_{O\_MEMS}$ and generates a current having a frequency approximately equal to $f_{O\_MEMS}+f_S$ to shift components of the time-varying magnetic field having a frequency $f_S$ into the sensitive range of MEMS device 702. This technique may be useful in current sensing applications to measure many harmonics present in a load current under conditions where the load itself is not changing rapidly with time. Referring to FIG. 8B, the mixing function of the Lorentz force shifts frequency components of $B(f_s)$ into the sensitive range of the MEMS device, which is centered at $f_{O\_MEMS}$, and are sensed by the MEMS magnetometer. Referring to FIGS. 8C and 8D, if the reference generator slowly sweeps the frequency of the current over a range of frequencies (e.g., varying $f_{CURRENT}$ between $f_{O\_MEMS}-f_1$ to $f_{O\_MEMS}+f_1$), the magnetic field as a function of frequency can be determined (e.g., B(f) where $-f_1 < f < f_1$).

Figure 9:
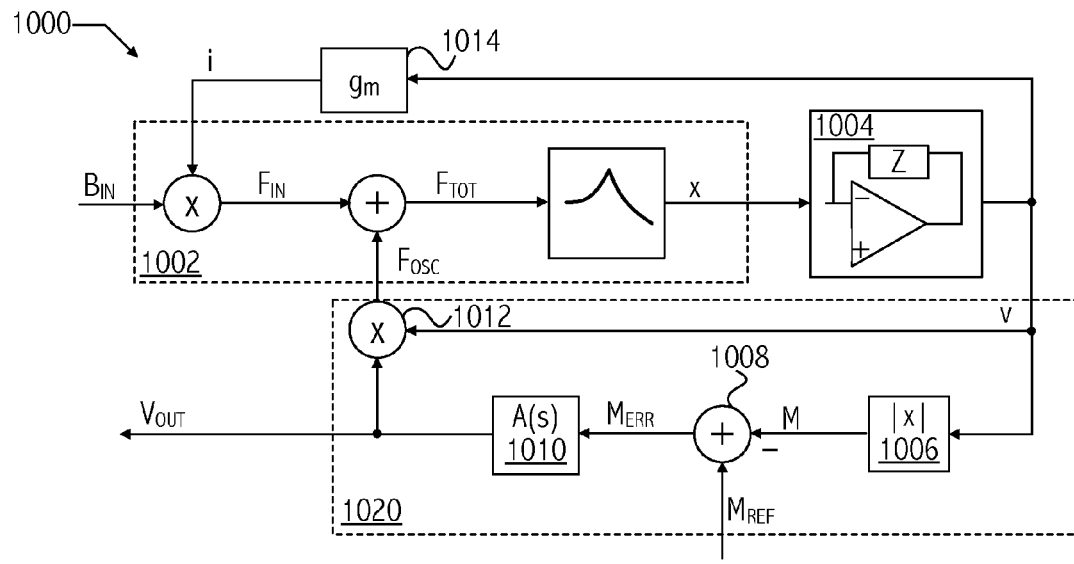
FIG. 9 illustrates a functional block diagram of the Lorentz-force magnetic sensor configured in an automatic gain control loop consistent with at least one embodiment of the invention.

The magnetic field as a function of frequency can be determined using embodiments of the force-feedback MEMS system described above in FIGS. 6A-7C or using an automatic gain control (AGC) technique. Referring to FIG. 9, magnetometer 1000 implements the AGC technique which configures MEMS device 1002 to resonate. The output of MEMS device 1002 is converted into a current modulated at the MEMS resonant frequency consistent with techniques described above with respect to FIGS. 3A and 3B. Sensing amplifier 1004 feeds back that current as the current flowing through the coil (e.g., $i_{LOOP}$) on the resonator, which is acted upon by the Lorentz force, thus providing a Lorentz force actuator. In addition, sensing amplifier 1004 provides the signal to AGC circuit 1020, which generates a control signal that is applied to MEMS device 1002 to maintain the output of the oscillator constant. Automatic gain control circuit 1020 receives a reference signal $M_{REF}$, which is a set point of the gain for the system, and compares that reference signal to the magnitude of the displacement of the moving mass of MEMS device 1002 (signal M, which is generated by module 1006). Summing module 1008 generates an error signal, $M_{ERR}$, which indicates the difference between reference signal $M_{REF}$ and signal M. Control module 1010 converts that error signal into a gain control signal that is indicative of the magnetic field. Frequency mixer 1012 modulates that signal to the MEMS resonant frequency and provides it to MEMS 1002, which applies the gain control as a drive signal to MEMS device 1002 to maintain the output of MEMS 1002 constant.

Other embodiments of an AGC technique and MEMS devices are described in U.S. patent application Ser. No. 13/174,417, entitled "MEMS-based Magnetic Sensor with a Lorentz Force Actuator Used as Force Feedback," naming Emmanuel P. Quevy as inventor, filed Jun. 30, 2011, which application is incorporated by reference herein.

Figure 10:
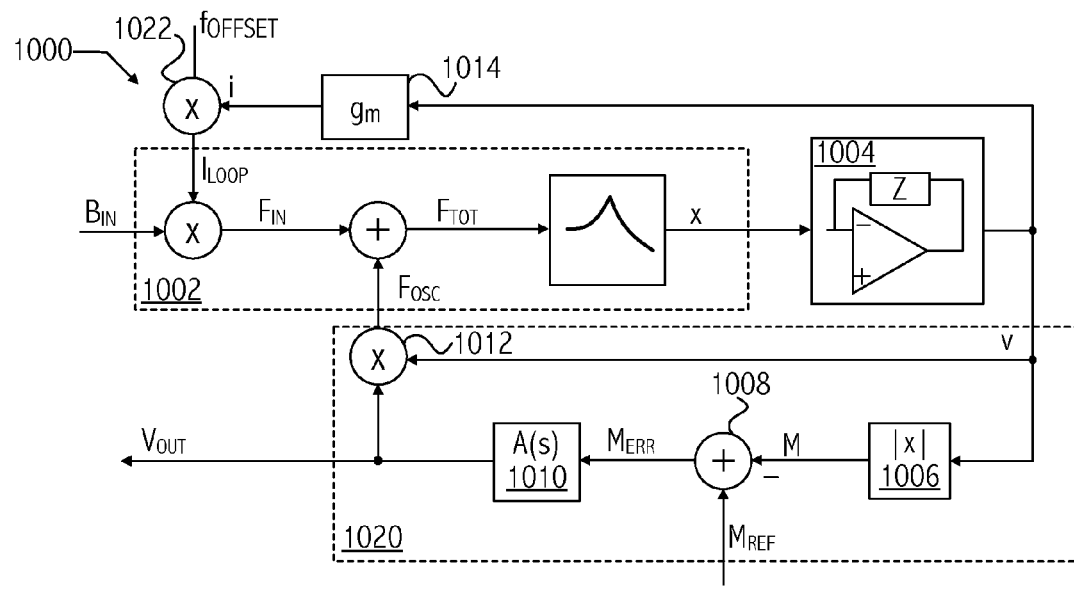
FIG. 10 illustrates a functional block diagram of the Lorentz-force magnetic sensor of FIG. 9 configured as a magnetic spectrometer consistent with at least one embodiment of the invention.

A magnetic spectrum analyzer can be implemented using the AGC magnetometer technique by configuring a MEMS device to resonate and generate a constant output by generating the loop current using an AGC. Referring to FIG. 10, mixer 1022 mixes the loop current generated based on a sensed output of MEMS 1002 with a frequency offset signal (e.g., $f_{OFFSET}$), which may be generated by a variable frequency signal generator (not shown). By slowly sweeping the offset frequency over a range of frequencies ($-f_1 < f < f_1$) the frequency of $f_{ILOOP}$ varies between $f_{O\_MEMS}-f_1$ to $f_{O\_MEMS}+f_1$ and the output signal $V_{OUT}$ will indicate that the magnetic field as a function of frequency can be determined.

The description of the invention set forth herein is illustrative, and is not intended to limit the scope of the invention as set forth in the following claims. For example, while the invention has been described in embodiments in which capacitive sensing is used, one of skill in the art will appreciate that the teachings herein can be utilized with other sensing techniques (e.g., piezoresistive, piezoelectric, optical, magnetic position detection). Variations and modifications of the embodiments disclosed herein, may be made based on the description set forth herein, without departing from the scope and spirit of the invention as set forth in the following claims.

What is claimed is:

1. A method comprising:
   supplying a current to at least one conductive path integral with a proof mass of a microelectromechanical system (MEMS) device to thereby exert a Lorentz force on the MEMS device in the presence of a magnetic field; and
   determining the magnetic field based on a control value in a control loop configured to apply a feedback force to the proof mass that opposes the Lorentz force to compensate for a displacement of the proof mass from a nominally stationary position.

2. The method, as recited in claim 1, wherein the current has a frequency approximately equal to a resonant frequency of the MEMS device ($f_{O\_MEMS}$).

3. The method, as recited in claim 1, wherein the control value is based on sensed displacements of the proof mass from the nominally stationary position.

4. The method, as recited in claim 1, further comprising:
   in a first mode of operating the MEMS device, generating a signal indicative of a resonant frequency of the MEMS device ($f_{O\_MEMS}$); and
   in a second mode of operating the MEMS device, generating the current based on the signal,
   wherein in the first mode, the proof mass is configured to resonate, and in the second mode, the MEMS device is included in the control loop.

5. The method, as recited in claim 4, wherein in the first mode of operating the MEMS device, generating the signal comprises:
   configuring the MEMS device to generate an oscillating signal; and
   comparing a frequency of the oscillating signal to a frequency of a reference clock signal and generating the signal based on the comparison.

6. The method, as recited in claim 4, wherein generating the current comprises:

adjusting a frequency of a version of a reference clock signal based on $f_{O\_MEMS}$.

7. The method, as recited in claim 1, further comprising:
applying a force to the proof mass in opposition to a difference between a frequency of the current and a resonant frequency of the MEMS device ($f_{O\_MEMS}$), wherein the frequency of the current is approximately $f_{O\_MEMS}$.

8. The method, as recited in claim 1, wherein supplying the current comprises:
generating the current using a second MEMS device configured to self-resonate.

9. The method, as recited in claim 8, wherein generating the current comprises:
applying a force to the second MEMS device based on a difference between a frequency of the current and a resonant frequency of the second MEMS device.

10. The method, as recited in claim 1, further comprising:
generating the current based on a reference clock signal; and
providing an output signal indicative of the magnetic field, the output signal being based on the control value and the reference clock signal.

11. The method, as recited in claim 1, further comprising:
generating the current based on a reference clock signal;
providing an output signal indicative of the magnetic field, the output signal being based on the displacement and the reference clock signal; and
generating the control value based on the output signal and a phase-shifted version of the reference clock signal.

12. The method, as recited in claim 1, further comprising:
varying a frequency of the current over a range of frequencies; and
determining a magnetic field as a function of frequency based on control values in the control loop, the control values corresponding to frequency values of the range of frequencies.

13. The method, as recited in claim 1, wherein the control loop is configured to generate the control value to apply the feedback force to the MEMS device to return the proof mass to the nominally stationary position.

14. The method, as recited in claim 1, wherein the displacement of the proof mass is with respect to a frame of the MEMS device.

15. An apparatus comprising:
at least one conductive path integral with a proof mass of a microelectromechanical system (MEMS) device configured to exert a Lorentz force on the MEMS device in response to a current and in the presence of a magnetic field; and
a circuit configured to determine the magnetic field based on a control value in a control loop configured to apply a feedback force to the proof mass that opposes the Lorentz force to compensate for a displacement of the proof mass of the MEMS device from a nominally stationary position.

16. The apparatus, as recited in claim 15, wherein the current has a frequency locked to a resonant frequency of the MEMS device ($f_{O\_MEMS}$).

17. The apparatus, as recited in claim 15, further comprising:
a mixer configured to generate an output signal indicative of the magnetic field based on the control value and a periodic reference signal used to generate the current.

18. The apparatus, as recited in claim 17, wherein the periodic reference signal has a frequency equal to a resonant frequency of the MEMS device ($f_{O\_MEMS}$).

19. The apparatus, as recited in claim 17, further comprising:
a second mixer configured to generate the control value based on the output signal and a phase-shifted version of the periodic reference signal used to generate the current.

20. The apparatus, as recited in claim 15, further comprising:
a reference signal generator configured to generate a periodic reference signal having a frequency equal to a resonant frequency of the MEMS device ($f_{O\_MEMS}$), wherein the current is generated using the periodic reference signal.

21. The apparatus, as recited in claim 20, wherein the reference signal generator comprises:
a second MEMS device having approximately a same resonant frequency as the MEMS device and configured to resonate at the resonant frequency and generate the periodic reference signal having a frequency equal to the resonant frequency.

22. The apparatus, as recited in claim 15, further comprising:
a reference signal generator configured to generate a clock signal having a reference frequency,
wherein the microelectromechanical system (MEMS) device further includes a drive actuation transducer configured to apply a required force to change the resonant frequency to the reference frequency.

23. The apparatus, as recited in claim 15, wherein the at least one conductive path includes a conductive path formed using isolated portions of conductive material included as part of the proof mass.

24. The apparatus, as recited in claim 15, further comprising:
the control loop configured to generate the control value to apply the feedback force to the MEMS device to return the proof mass to the nominally stationary position.

25. A method comprising:
supplying a sensing signal to a microelectromechanical system (MEMS) device;
supplying a current to at least one conductive path integral with a mass of the MEMS device to thereby exert a Lorentz force on the MEMS device in the presence of a magnetic field;
generating an output signal having a level proportional to displacement from a nominally stationary position of the mass of the MEMS device with respect to a frame of the MEMS device, the output signal being generated by the MEMS device using the sensing signal;
generating a feedback force based on the output signal, the feedback force compensating for the displacement to return the mass of the MEMS device to the nominally stationary position, the feedback force being approximately equal and opposite to the Lorentz force; and
generating a magnetic sensor output signal indicative of the magnetic field based on a control value in a control loop configured to generate the feedback force based on the output signal.

* * * * *